United States Patent
Tsai et al.

(10) Patent No.: US 11,088,057 B2
(45) Date of Patent: Aug. 10, 2021

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Yu-Pin Tsai, Kaohsiung (TW); Man-Wen Tseng, Kaohsiung (TW); Yu-Ting Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/409,669

(22) Filed: May 10, 2019

(65) Prior Publication Data

US 2020/0357730 A1    Nov. 12, 2020

(51) Int. Cl.

| H01L 21/48 | (2006.01) |
|---|---|
| H01L 23/498 | (2006.01) |
| H01L 23/538 | (2006.01) |
| H01L 23/00 | (2006.01) |

(52) U.S. Cl.
CPC .... H01L 23/49811 (2013.01); H01L 21/4853 (2013.01); H01L 23/5384 (2013.01); H01L 23/5385 (2013.01); H01L 23/5386 (2013.01); H01L 24/14 (2013.01); H01L 2225/06513 (2013.01)

(58) Field of Classification Search
CPC ............ H01L 23/49811; H01L 23/5384; H01L 23/5385; H01L 23/5386; H01L 2225/06513; H01L 21/4853; H01L 24/14
See application file for complete search history.

(56) References Cited

U.S. PATENT DOCUMENTS

| 2018/0061767 | A1 | 3/2018 | Chiang et al. | |
|---|---|---|---|---|
| 2018/0061813 | A1* | 3/2018 | Hsieh | H01L 23/28 |
| 2019/0103353 | A1* | 4/2019 | Liu | H01L 24/09 |
| 2019/0148276 | A1* | 5/2019 | Chen | H01L 21/82 |
| | | | | 257/774 |
| 2020/0006220 | A1* | 1/2020 | Pan | H01L 23/293 |

* cited by examiner

*Primary Examiner* — Timor Karimy
(74) *Attorney, Agent, or Firm* — Foley & Lardner LLP

(57) ABSTRACT

A semiconductor package structure includes a wiring structure, a semiconductor module, a protection layer and a plurality of outer conductive vias. The wiring structure includes at least one dielectric layer and at least one redistribution layer. The semiconductor module is electrically connected to the wiring structure. The semiconductor module has a first surface, a second surface opposite to the first surface and a lateral surface extending between the first surface and the second surface. The protection layer covers the lateral surface of the semiconductor module and a surface of the wiring structure. The outer conductive vias surround the lateral surface of the semiconductor module, electrically connect to the wiring structure, and extend through a dielectric layer of the wiring structure and the protection layer.

18 Claims, 29 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure including a plurality of conductive vias, and a method for manufacturing the semiconductor package structure.

2. Description of the Related Art

A semiconductor package structure may include a plurality of semiconductor die. The electrical connection between the semiconductor die can be important. In some devices, a plurality of micro bumps are used for connecting a semiconductor die to a package substrate by flip chip bonding, and a plurality of interconnection solder balls are used for connecting two semiconductor packages to form a package on package (POP) structure. However, such flip chip bonding specifies a very high die attach accuracy to avoid connection failure, and thus a low cycle time may be difficult to achieve. Further, the interconnection solder balls may increase the overall thickness of the semiconductor package structure. Improved manufacturing techniques are thus desirable.

SUMMARY

In some embodiments, a semiconductor package structure includes a wiring structure, a semiconductor module, a protection layer and a plurality of outer conductive vias. The wiring structure includes at least one dielectric layer and at least one redistribution layer. The semiconductor module is electrically connected to the wiring structure. The semiconductor module has a first surface, a second surface opposite to the first surface and a lateral surface extending between the first surface and the second surface. The protection layer covers the lateral surface of the semiconductor module and a surface of the wiring structure. The outer conductive vias surround the lateral surface of the semiconductor module, electrically connect to the wiring structure, and extend through a dielectric layer of the wiring structure and the protection layer.

In some embodiments, a method for manufacturing a semiconductor package structure includes: (a) providing at least one semiconductor module, wherein the semiconductor module includes a conductive structure, at least one semiconductor die and an encapsulant, the semiconductor die is electrically connected to the conductive structure, and the encapsulant covers at least a portion of the semiconductor die and a surface of the conductive structure; (b) attaching the at least one semiconductor module to a base material; (c) forming a protection layer to cover the at least one semiconductor module; and (d) forming a wiring structure on the protection layer and a plurality of outer conductive vias in the protection layer and surrounding the at least one semiconductor module, wherein the at least one semiconductor module and the outer conductive vias are electrically connected to the wiring structure, and the outer conductive vias extend through a dielectric layer of the wiring structure and the protection layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
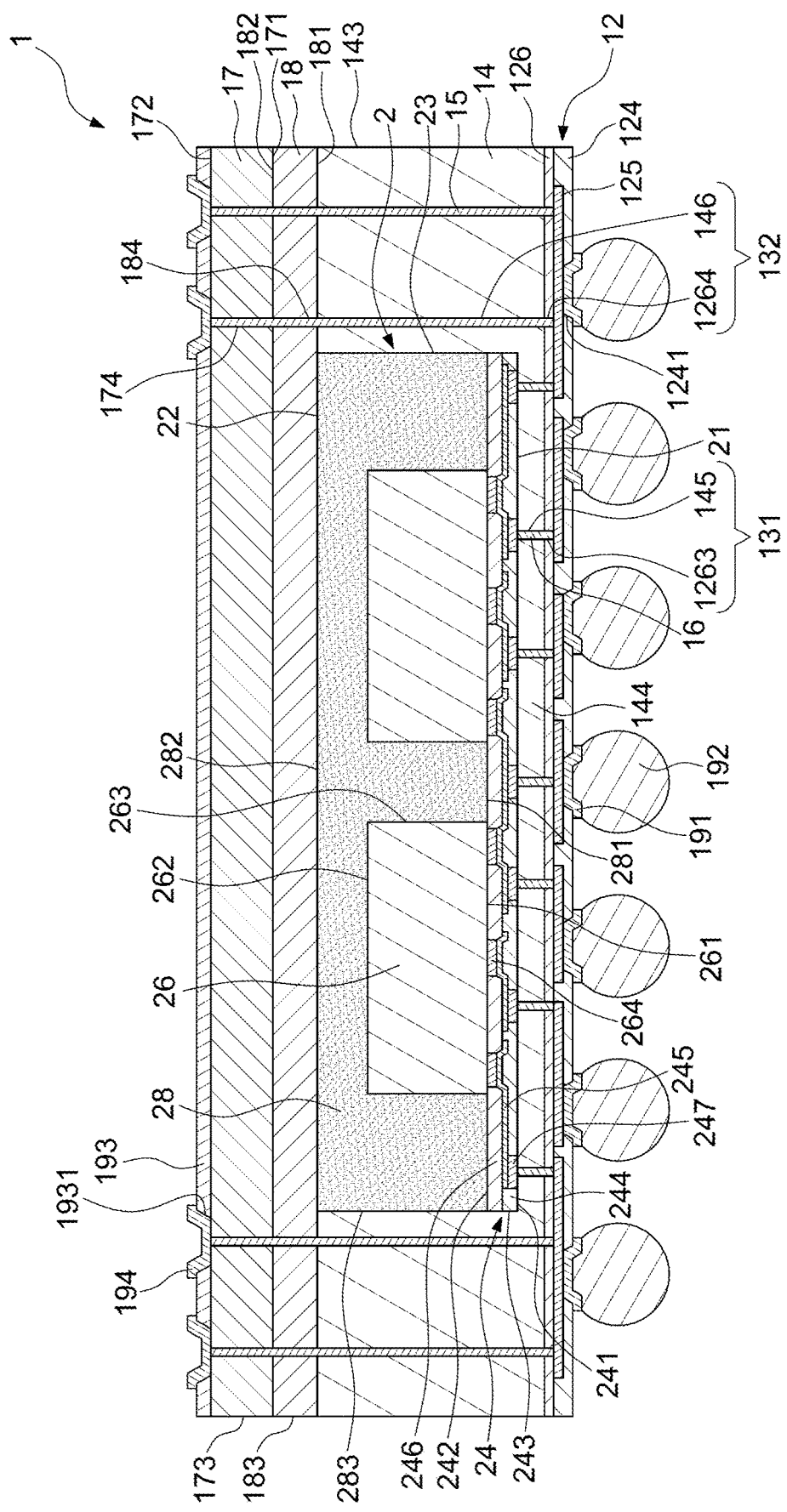
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative semiconductor package structure, a plurality of semiconductor dies are attached to a package substrate by flip chip bonding. In addition, a bridge or an interconnection chip is embedded in the package substrate for electrically connecting two semiconductor die. However, the semiconductor die may have different sizes, and numerous die attach processes are performed for numerous die. Each die attach may have a very high die attach accuracy to avoid connection failure, and a high cycle time may be a concern. Further, the flip chip bonding technique uses interconnection micro bumps or interconnection solder balls for connections, so that the overall thickness of the semiconductor package structure is not reduced efficiently. Furthermore, warpage issues and intermetallic compound (IMC) issues are also concerns for flip chip bonding, thereby decreasing the package reliability. Moreover, the electrical path from a first semiconductor die to a second semiconductor die is: the first semiconductor die, the interconnection micro bumps (or interconnection solder balls), the bridge (or interconnection chip), the interconnection micro bumps (or interconnection solder balls) and the second semiconductor die, which results in a long electrical routing. Therefore, electrical properties of the device are poor (e.g., a high resistive-capacitive delay (RC delay)). In addition, the micro bump or solder ball may be large, thus, the interconnection density (e.g., density of input/output (I/O) count) is limited.

The present disclosure addresses at least the above concerns and provides for an improved semiconductor package structure, and improved techniques for manufacturing the semiconductor package structure. In the semiconductor package structure, at least one semiconductor die and at least one redistribution layer are combined into a semiconductor module, thus, the micro bump or the solder ball can be omitted. The semiconductor module is embedded in a protection layer, thus, the overall thickness of the semiconductor package structure is reduced efficiently.

FIG. 1 illustrates a cross-sectional view of a semiconductor package structure 1 according to some embodiments of the present disclosure. The semiconductor package structure 1 includes a wiring structure 12, a semiconductor module 2, a protection layer 14, a plurality of outer conductive vias 15, a base material 17, an adhesion layer 18, a plurality of first under bump metallization (UBM) layers 191, a plurality of solder balls 192, an insulation layer 193 and a plurality of second under bump metallization (UBM) layers 194.

The wiring structure 12 includes at least one dielectric layer (including, for example, a first dielectric layer 124 and a second dielectric layer 126) and at least one redistribution layer 125 disposed between the dielectric layer (including, for example, the first dielectric layer 124 and the second dielectric layer 126). As shown in FIG. 1, the second dielectric layer 126 is disposed on the first dielectric layer 124, and the redistribution layer 125 is disposed between the first dielectric layer 124 and the second dielectric layer 126. However, the number of the dielectric layer may be two, three, four or more, and the number of the redistribution layer may be one, two, three or more. The dielectric layer (including, for example, the first dielectric layer 124 and the second dielectric layer 126) may include, or be formed from, a photoresist layer, a cured photo sensitive material, a cured photoimageable dielectric (PID) material such as epoxy or polyimide (PI) including photoinitiators, or a combination of two or more thereof. In some embodiments, the second dielectric layer 126 may be an innermost dielectric layer, and defines a plurality of inner through holes 1263 and outer through holes 1264 extending through the second dielectric layer 126 to expose upper portions of the redistribution layer 125. The first dielectric layer 124 may be an outermost dielectric layer, and defines a plurality of openings 1241 to expose lower portions of the redistribution layer 125. The redistribution layer 125 may be a patterned circuit layer. A line width/line space (L/S) of the redistribution layer 125 may be about 5 micrometers (μm)/about 5 μm or about 7 μm/about 7 μm.

The semiconductor module 2 is electrically connected to the wiring structure 12, and has a first surface 21, a second surface 22 opposite to the first surface and a lateral surface 23 extending between the first surface 21 and the second surface 22. In some embodiments, the semiconductor module 2 includes a conductive structure 24, at least one semiconductor die 26 and an encapsulant 28. The conductive structure 24 has a first surface 241, a second surface 242 opposite to the first surface 242 and a lateral surface 243 extending between the first surface 241 and the second surface 242, and is electrically connected to the wiring structure 12. As shown in FIG. 1, the conductive structure 24 includes at least one dielectric layer (including, for example, a first dielectric layer 244 and a second dielectric layer 246), at least one redistribution layer 245 and a plurality of electrical connectors 247. As shown in FIG. 1, the second dielectric layer 246 is disposed on the first dielectric layer 244, and the redistribution layer 245 is disposed between the first dielectric layer 244 and the second dielectric layer 246. However, the number of the dielectric layer may be two, three, four or more, and the number of the redistribution layer may be one, two, three or more. The dielectric layer (including, for example, the first dielectric layer 244 and the second dielectric layer 246) may include, or be formed from, a photoresist layer, a cured photo sensitive material, a cured photoimageable dielectric (PID) material such as epoxy or polyimide (PI) including photoinitiators, or a combination of two or more thereof. In some embodiments, the second dielectric layer 246 may be an innermost dielectric layer, and the first dielectric layer 244 may be an outermost dielectric layer. The electrical connectors 247 may be embedded in the first dielectric layer 244 to contact and electrically connect the redistribution layer 245. The electrical connectors 247 extend through and are exposed from the first dielectric layer 244. The redistribution layer 245 may be a patterned circuit layer. A line width/line space (L/S) of the redistribution layer 245 of the conductive structure 24 is less than the line width/line space (L/S) of the redistribution layer 125 of the wiring structure 12. For example, the line width/line space (L/S) of the redistribution layer 245 may be about 2 micrometers (μm)/about 2 μm or less.

The semiconductor die 26 is disposed on and electrically connected to the conductive structure 24. As shown in FIG. 1, two semiconductor die 26 are disposed on the conductive structure 24 side by side; however, the number of the semiconductor die 26 may be one, three, four or more. In some embodiments, the sizes of the semiconductor die 26 may be the same as or different from each other. The semiconductor die 26 has a first surface 261 (e.g., an active surface), a second surface 262 (e.g., a backside surface) and a lateral surface 263. The second surface 262 is opposite to the first surface 261, and the lateral surface 263 extends between the first surface 261 and the second surface 262. In some embodiments, the first surface 261 of the semiconductor die 26 contacts the second dielectric layer 246 of the conductive structure 24. The semiconductor die 26 may include a plurality of conductive pillars 264 disposed adjacent to the first surface 261. The conductive pillars 264 are embedded in and extend through the second dielectric layer 246 of the conductive structure 24 to electrically contact the redistribution layer 245.

The encapsulant 28 covers at least a portion of the semiconductor die 26 and the second surface 242 of the conductive structure 24. In some embodiments, the encapsulant 28 contacts the second dielectric layer 246 of the conductive structure 24. The material of the encapsulant 28 may include a molding compound with or without fillers. The encapsulant 28 has a first surface 281, a second surface 282 and a lateral surface 283. The second surface 282 is opposite to the first surface 281, and the lateral surface 283 extends between the first surface 281 and the second surface 282. As shown in FIG. 1, the second surface 282 of the encapsulant 28 is higher than the second surface 262 of the semiconductor die 26, so that the encapsulant 28 covers the second surface 282 and the lateral surface 283 of the semiconductor die 28. Further, the first surface 261 of the semiconductor die 26 is substantially coplanar with the first surface 281 of the encapsulant 28. In other words, the first surface 261 of the semiconductor die 26 may be exposed from the first surface 281 of the encapsulant 28. Thus, a thickness of the encapsulant 28 is greater than a thickness of the semiconductor die 26. In addition, the encapsulant 28 may not cover the conductive pillars 264. In some embodiments, the lateral surface 243 of the conductive structure 24 is substantially coplanar with the lateral surface 283 of the encapsulant 28.

The protection layer 14 covers the lateral surface 23 of the semiconductor module 2 and the first surface 21 of the semiconductor module 2 (e.g., the first surface 241 of the wiring structure 24). The protection layer 14 may include, or be formed from, a photoresist layer, a cured photo sensitive material, a cured photoimageable dielectric (PID) material such as epoxy or polyimide (PI) including photoinitiators, or a combination of two or more thereof. In some embodiments, the protection layer 14 may include, or be formed from a film type material such as Ajinomoto build-up film (ABF), or a liquid type material such as solder mask. In some embodiments, the material of the protection layer 14 may be the same as or different from the material of the dielectric layer (including, for example, the first dielectric layer 124 and the second dielectric layer 126) of the wiring structure 12, and the material of the protection layer 14 may be the same as or different from the material of the dielectric layer (including, for example, the first dielectric layer 244 and the second dielectric layer 246) of the conductive structure 24. In addition, the material of the protection layer 14 may be different from the material of the encapsulant 28. For example, the encapsulant 28 may include fillers and the protection layer 14 may not include any fillers.

A first portion 144 of the protection layer 14 may extend into a space between the semiconductor module 2 and the wiring structure 12. Thus, the first portion 144 of the protection layer 14 is disposed between the semiconductor module 2 and the wiring structure 12, and covers and contacts the second dielectric layer 126 of the wiring structure 2 and the first dielectric layer 244 of the conductive structure 24. However, the first portion 144 of the protection layer 14 may be omitted and the semiconductor module 2 may contact the wiring structure 12. As shown in FIG. 1, the protection layer 14 defines a plurality of inner through holes 145 and a plurality of outer through holes 146. The inner through holes 145 are disposed in the first portion 144 of the protection layer 14 and correspond to the electrical connectors 247 of the conductive structure 24 of the semiconductor module 2. Each of the inner through holes 145 of the protection layer 14 and each of the inner through holes 1263 of the second dielectric layer 126 of the wiring structure 12 collectively define a single inner hole 131 for accommodating the inner conductive via 16. In some embodiments, the inner through hole 145 of the protection layer 14 and a respective one of the inner through holes 1263 of the second dielectric layer 126 of the wiring structure 12 are formed by dry sandblasting concurrently. In addition, the outer through holes 146 surround the semiconductor module 2. Each of the outer through holes 146 of the protection layer 14 and each of the outer through holes 1264 of the second dielectric layer 126 of the wiring structure 12 collectively define a single outer hole 132 for accommodating the outer conductive via 15. In some embodiments, the outer through hole 146 of the protection layer 14 and a respective one of the outer through holes 1264 of the second dielectric layer 126 of the wiring structure 12 are formed by dry sandblasting concurrently. A ratio of a maximum diameter of a first end of the single outer hole 132 to a maximum diameter of a second end of the single outer hole 132 is about 1:0.7 to about 1:0.95. That is, the single outer hole 132 has a substantially consistent diameter. In some embodiments, a maximum diameter of the single outer hole 132 is less than 100 μm, and a surface roughness of a sidewall of the single outer hole 132 is less than about 0.08 μm.

The inner conductive vias 16 are disposed in the single inner holes 131 under the semiconductor module 2 for electrically connecting the conductive structure 24 of the semiconductor module 2 and the wiring structure 12. The inner conductive vias 16 extend through the second dielectric layer 126 of the wiring structure 12 and the first portion 144 of the protection layer 14. Further, the outer conductive vias 15 are disposed in the single outer hole 132 surrounding the lateral surface 23 of the semiconductor module 2, and are electrically connected to the wiring structure 12. The outer conductive vias 15 extend through the second dielectric layer 126 of the wiring structure 12 and the protection layer 14. As shown in FIG. 1, a length of each of the outer conductive vias 15 is greater than a thickness of the encapsulant 28 and a thickness of the protection layer 14. The inner conductive vias 16, the outer conductive vias 15 and the redistribution layer 125 of the wiring structure 12 may be formed concurrently at one process stage.

The base material 17 may include resin such as BT resin. The base material 17 has a first surface 171, a second surface 172 and a lateral surface 173. The second surface 172 is opposite to the first surface 171, and the lateral surface 173 extends between the first surface 171 and the second surface 172. The base material 17 defines a plurality of through holes 174. The adhesion layer 18 is disposed between the second surface 22 of the semiconductor module 2 and the first surface 171 of the base material 17, and between the protection layer 14 and the first surface 171 of the base material 17. In other words, the semiconductor module 2 and the protection layer 14 are adhered to the base material 17 by the adhesion layer 18. In some embodiments, a coefficient of thermal expansion (CTE) of the base material 17 is less than 5 parts-per-million per degree Celsius (ppm/° C.) so as to reduce the warpage of the semiconductor package structure 1. A Young's modulus of the base material 17 is greater than 2500 Pa, and a melting point of the base material 17 is greater than 260° C.

In some embodiments, the adhesion layer 18 may be a thermal release film including epoxy. In other words, the adhesion layer 18 may be a tape that is not sticky at room temperature and becomes adhesive after heating. In some embodiments, a material of adhesion layer 18 may be the same as or different from a material of the base material 17, and a material of adhesion layer 18 may be the same as or different from the material of the protection layer 14. As shown in FIG. 1, the adhesion layer 18 has a first surface 181, a second surface 182 and a lateral surface 183. The second surface 182 is opposite to the first surface 181, and the lateral surface 183 extends between the first surface 181 and the second surface 182. The lateral surface 183 of the adhesion layer 18 is substantially coplanar with the lateral surface 173 of the base material 17 and the lateral surface 143 of the protection layer 14.

The adhesion layer 18 defines a plurality of through holes 184 corresponding to the through holes 174 of the base material 17 and the 146 outer through holes 146 of the protection layer 14. The through hole 174 of the base material 17 and the through hole 184 of the adhesion layer 18 are further included in the single outer hole 132. That is, the through hole 174 of the base material 17, the through hole 184 of the adhesion layer 18, the outer through hole 146 of the protection layer 14 and the outer through hole 1264 of the second dielectric layer 126 of the wiring structure 12 collectively define the single outer hole 132 for accommodating the outer conductive via 15. In some embodiments, the through hole 174 of the base material 17, the through hole 184 of the adhesion layer 18, the outer through hole 146 of the protection layer 14 and the outer through hole 1264 of the second dielectric layer 126 of the wiring structure 12 are formed by dry sandblasting concurrently. A ratio of a maximum diameter of a first end (e.g., an end adjacent to the redistribution layer 125 of the wiring structure 12) of the single outer hole 132 to a maximum diameter of a second end (e.g., an end adjacent to the second surface 172 of the base material 17) of the single outer hole 132 is about 1:0.7 to about 1:0.95. That is, the single outer hole 132 has a substantially consistent diameter. In some embodiments, a maximum diameter of the single outer hole 132 (e.g., a maximum diameter of a portion of the single outer hole 132 adjacent to the redistribution layer 125 of the wiring structure 12) is less than 100 μm.

The outer conductive via 15 further extends into the through hole 174 of the base material 17 and the through hole 184 of the adhesion layer 18. Thus, the outer conductive via 15 further extends through the adhesion layer 18 and the base material 17.

The first under bump metallization (UBM) layers 191 are respectively disposed in respective ones of the openings 1241 of the first dielectric layer 124 of the wiring structure 12, and physically connected to the exposed redistribution layer 125 of the wiring structure 12. The solder balls 192 are respectively disposed on respective ones of the first under bump metallization (UBM) layers 191 for external connection, and are electrically connected to the redistribution layer 125 of the wiring structure 12 through the first under bump metallization (UBM) layers 191. The insulation layer 193

(e.g., a solder mask) is disposed on the second surface 172 of the base material 17, and defines a plurality of openings 1931 to expose an end of the outer conductive via 15. The second under bump metallization (UBM) layers 194 are respectively disposed in respective ones of the openings 1931 of the insulation layer 193 to contact the outer conductive via 15 for external connection.

According to at least some embodiments of the present disclosure, as shown in the embodiments illustrated in FIG. 1, since the semiconductor die 26 is electrically connected to the wiring structure 12 by the conductive structure 24 and the inner conductive vias 16, the flip chip bonding technique may be omitted. Thus, interconnection micro bumps (or interconnection solder balls) may be omitted, so that the overall thickness of the semiconductor package structure 1 can be reduced efficiently, and the interconnection density (e.g., density of input/output (I/O) count) is high. During a manufacturing process, the semiconductor die 26 are first combined into a semiconductor module 2, then the semiconductor module 2 is adhered to the base material 17. Thus, even if the semiconductor die 26 have different sizes, numerous die attach processes may be omitted for the numerous die. Thereby, the cycle time is improved. Furthermore, warpage issues and intermetallic compound (IMC) issues can be avoided, thereby increasing the package reliability. Moreover, the electrical path from the semiconductor die 26 to the wiring structure 12 is short, as compared to some comparative examples, which results in a short electrical routing. Therefore, electrical properties of the device are excellent (e.g., a low resistive-capacitive delay (RC delay)). In addition, the inner holes 131 and the outer holes 132 may be formed by dry sandblasting, thus, delamination or crack at the boundary between the second dielectric layer 126 of the wiring structure 12 and the protection layer 14, at the boundary between the protection layer 14 and the adhesion layer 18, and at the boundary between the adhesion layer 18 the base material 17 will not readily occur. Further, an aspect ratio (a ratio of depth to width) of the outer hole 132 may be greater than or equal to about 25:1, about 30:1, about 35:1, or about 40:1. Thus, a density of the outer conductive via 15 is increased.

Figure 2:
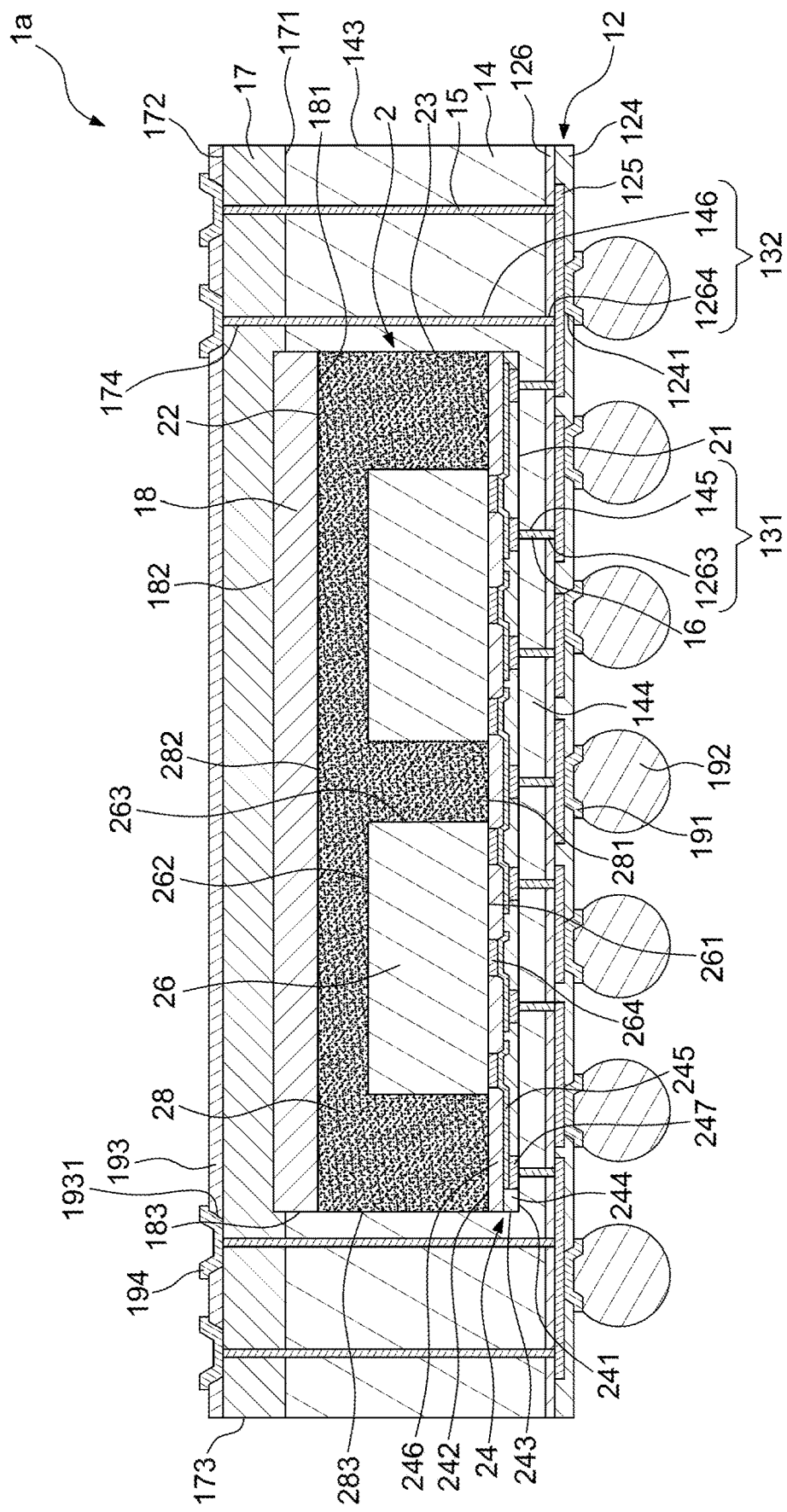
FIG. 2 illustrates a cross-sectional view of a semiconductor package structure according to some embodiments of the present disclosure.

FIG. 2 illustrates a cross-sectional view of a semiconductor package structure 1a according to some embodiments of the present disclosure. The semiconductor package structure 1a of FIG. 2 is similar to the semiconductor package structure 1 as shown in FIG. 1, except a structure of the adhesion layer 18. As shown in FIG. 2, the lateral surface 183 of the adhesion layer 18 is substantially coplanar with the lateral surface 283 of the encapsulant 28. Further, a portion (e.g., a top portion) of the adhesion layer 18 may be embedded in the base material 17.

Figure 3:
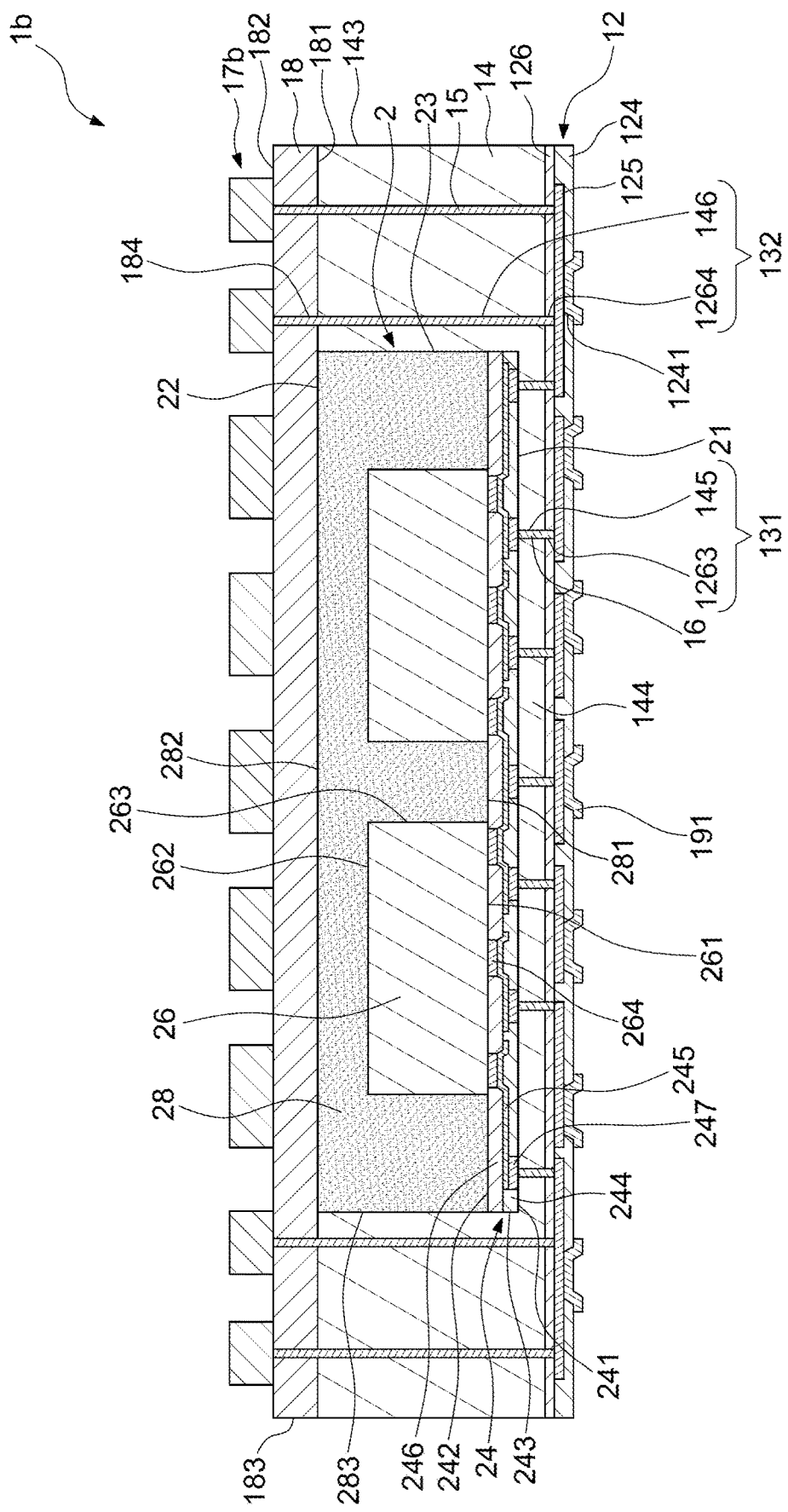
FIG. 3 illustrates a cross-sectional view of a semiconductor package structure according to some embodiments of the present disclosure.

FIG. 3 illustrates a cross-sectional view of a semiconductor package structure 1b according to some embodiments of the present disclosure. The semiconductor package structure 1b of FIG. 3 is similar to the semiconductor package structure 1 as shown in FIG. 1, except a structure of the base material 17b. As shown in FIG. 3, the base material 17b is a patterned circuit layer, and a material of the base material 17b may be copper or other suitable material. The outer hole 132 and the outer conductive via 15 may terminate at or on the base material 17b.

Figure 4:
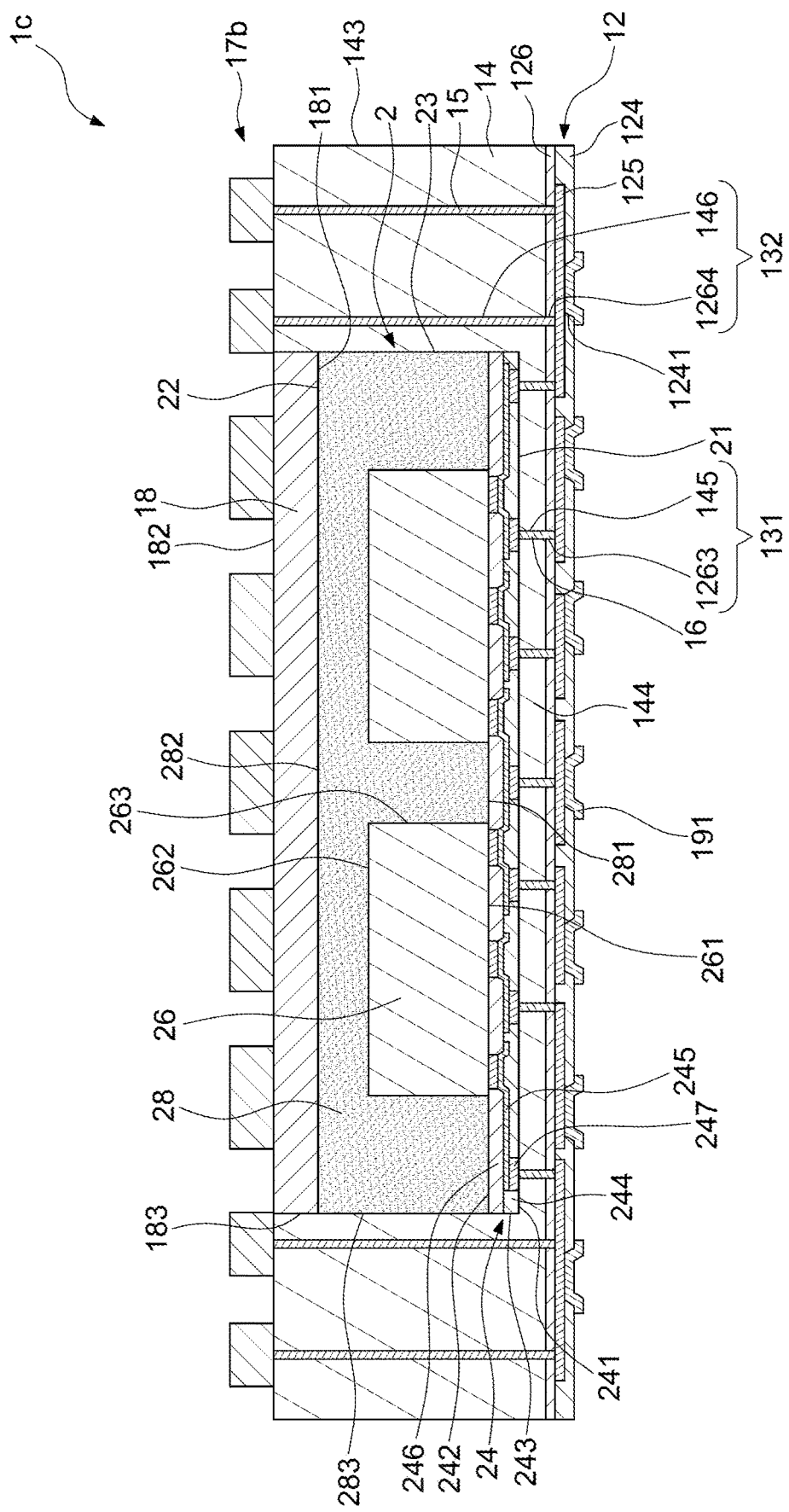
FIG. 4 illustrates a cross-sectional view of a semiconductor package structure according to some embodiments of the present disclosure.

FIG. 4 illustrates a cross-sectional view of a semiconductor package structure 1c according to some embodiments of the present disclosure. The semiconductor package structure 1c of FIG. 4 is similar to the semiconductor package structure 1b as shown in FIG. 3, except a structure of the adhesion layer 18. As shown in FIG. 4, the lateral surface 183 of the adhesion layer 18 is substantially coplanar with the lateral surface 283 of the encapsulant 28.

Figure 5:
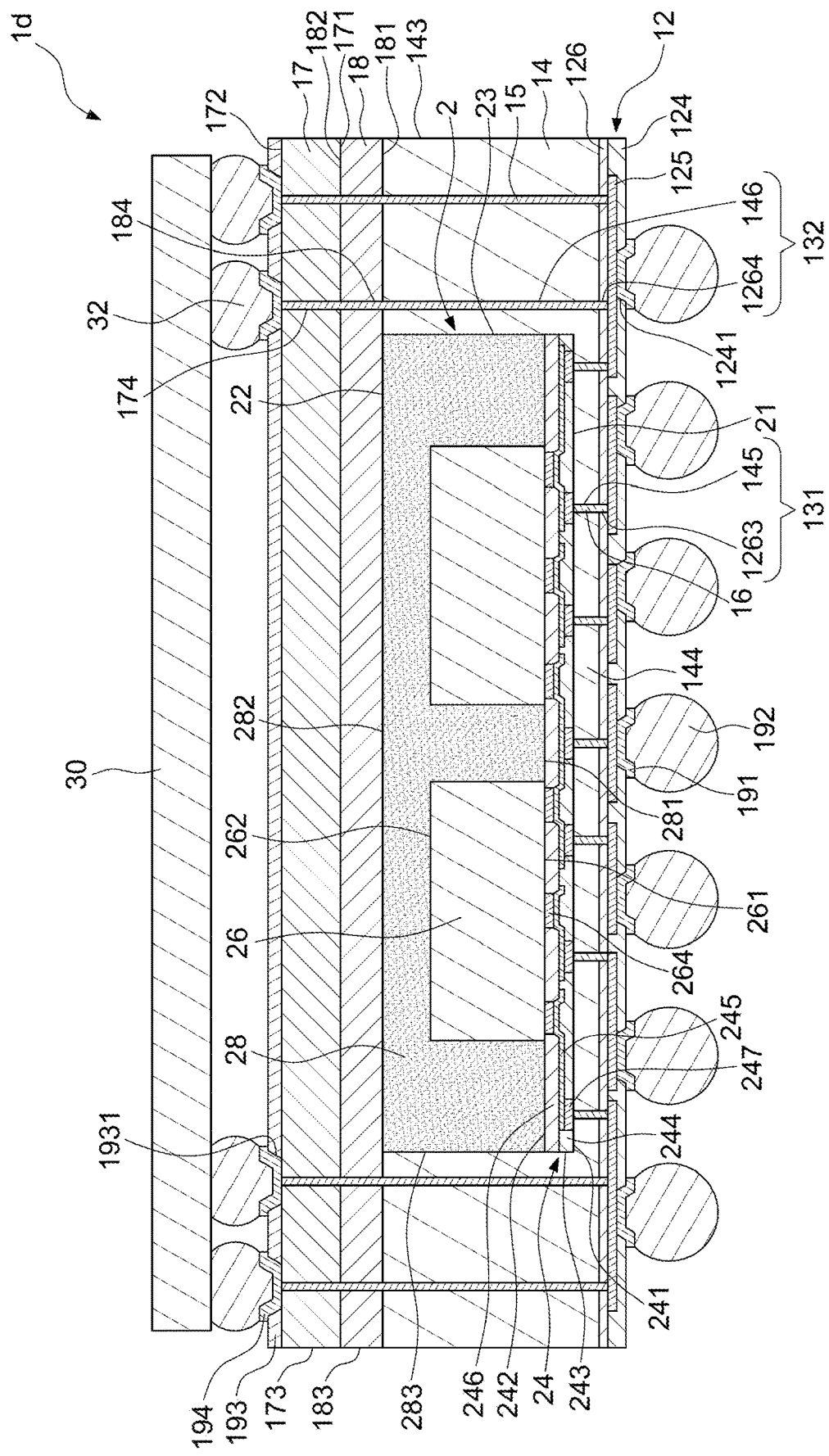
FIG. 5 illustrates a cross-sectional view of a semiconductor package structure according to some embodiments of the present disclosure.

FIG. 5 illustrates a cross-sectional view of a semiconductor package structure 1d according to some embodiments of the present disclosure. The semiconductor package structure 1d of FIG. 5 is similar to the semiconductor package structure 1 as shown in FIG. 1, except that a semiconductor chip 30 and a plurality of connecting elements 32 (e.g., solder bumps or other conductive bumps) are further included. The semiconductor chip 30 is electrically connected and bonded to the second under bump metallization (UBM) layers 194 through the connecting elements 32. In addition, the solder balls 192 may be electrically connected and bonded to a mother board such as a printed circuit board (PCB).

Figure 6:
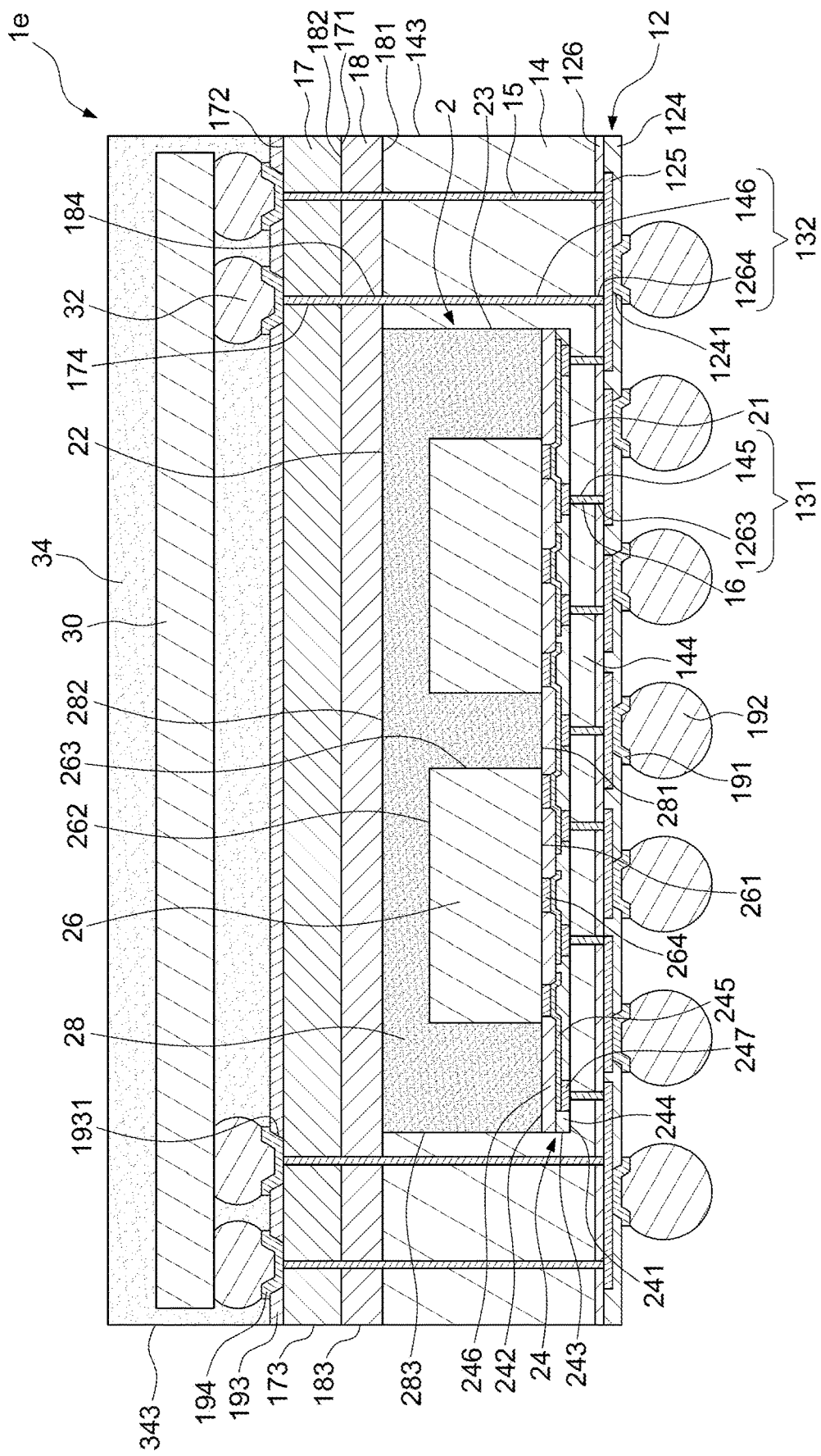
FIG. 6 illustrates a cross-sectional view of a semiconductor package structure according to some embodiments of the present disclosure.

FIG. 6 illustrates a cross-sectional view of a semiconductor package structure 1e according to some embodiments of the present disclosure. The semiconductor package structure 1e of FIG. 6 is similar to the semiconductor package structure 1d as shown in FIG. 5, except that a package body 34 (e.g., a molding compound) is further included. The package body 34 is disposed on the insulation layer 193 to cover and protect the semiconductor chip 30 and the connecting elements 32. In some embodiments, a lateral surface 343 of the package body 34 may be substantially coplanar with the lateral surface 173 of the base material 17, the lateral surface 183 of the adhesion layer 18 and the lateral surface 143 of the protection layer 14.

FIG. 7 through FIG. 21 illustrate a method for manufacturing a semiconductor package structure according to some embodiments of the present disclosure. In some embodiments, the method is for manufacturing a semiconductor package structure such as the semiconductor package structure 1 shown in FIG. 1.

Figure 7:
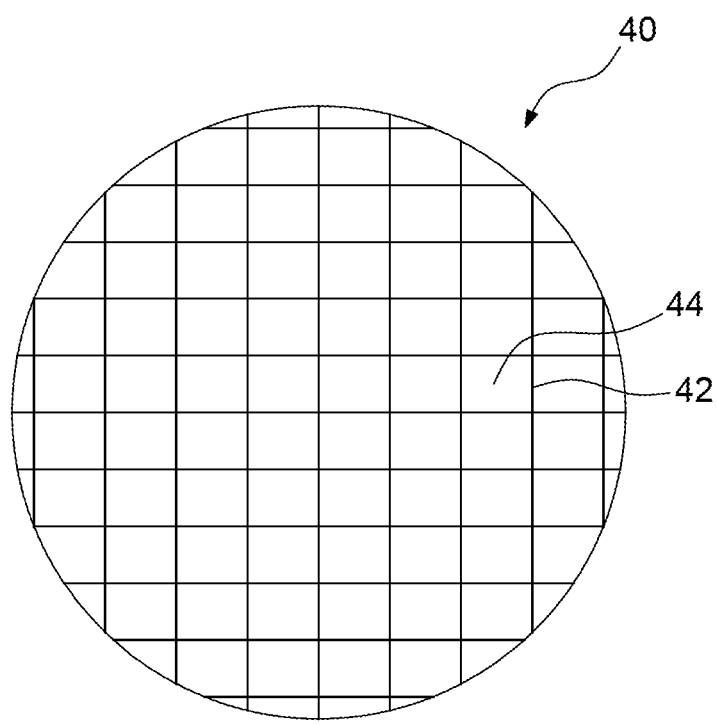
FIG. 7 illustrates one or more stages of an example of a method for manufacturing a semiconductor package structure according to some embodiments of the present disclosure.

Referring to FIG. 7, a wafer 40 (e.g., silicon wafer) is provided. The wafer 40 includes a plurality of die units 44 defined by a plurality of cutting lines 42.

Figure 8:
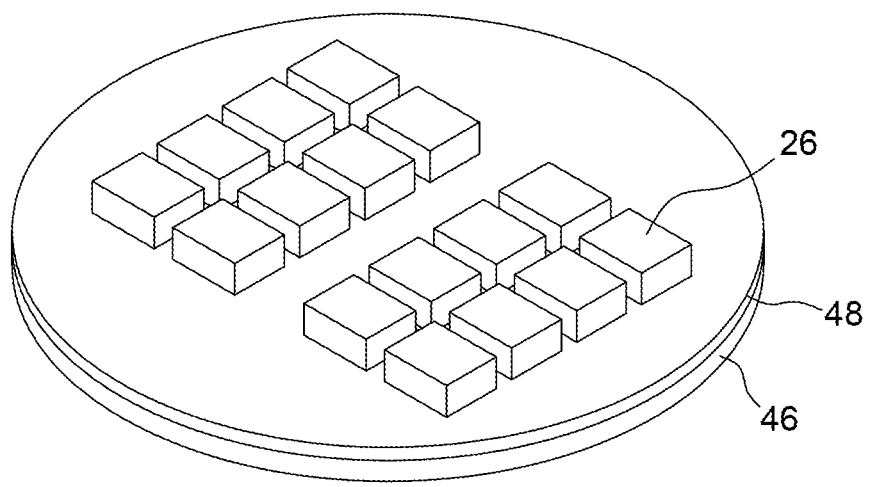
FIG. 8 illustrates one or more stages of an example of a method for manufacturing a semiconductor package structure according to some embodiments of the present disclosure.

Referring to FIG. 8, the wafer 40 is singulated to form a plurality of semiconductor die 26. Then, a carrier 46 and a release film 48 are provided. The carrier 46 may be, for example, a metal material, a ceramic material, a glass material, a substrate or a semiconductor wafer. The release film 48 is disposed on a surface of the carrier 46. Then, the semiconductor die 26 may be tested, and the known good semiconductor die 26 are reconstituted or rearranged on the release film 48 on the carrier 46.

Figure 9:
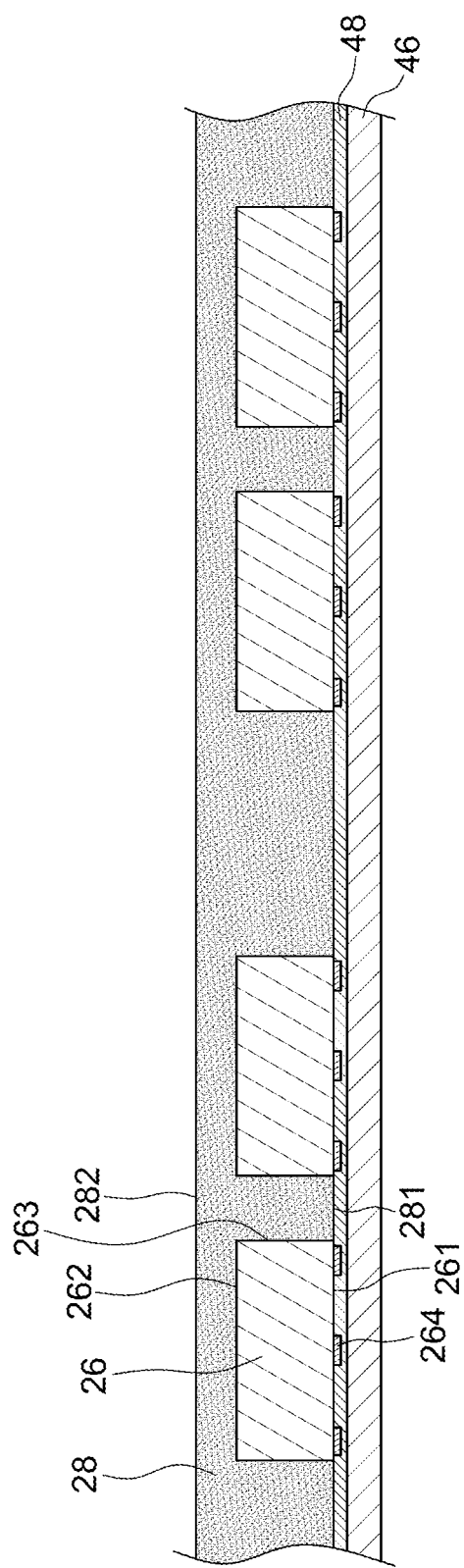
FIG. 9 illustrates one or more stages of an example of a method for manufacturing a semiconductor package structure according to some embodiments of the present disclosure.

Referring to FIG. 9, an encapsulant 28 is formed or disposed on a surface of the release film 48 to cover the semiconductor die 26. The material of the encapsulant 28 may include a molding compound. As shown in FIG. 9, two semiconductor die 26 are disposed on the carrier 46 next to each other in a unit area; however, the number of the semiconductor die 26 may be one, three, four or more. In some embodiments, the sizes of the semiconductor die 26 may be the same as or different from each other. The semiconductor die 26 has a first surface 261 (e.g., an active surface), a second surface 262 (e.g., a backside surface) and a lateral surface 263. The second surface 262 is opposite to the first surface 261, and the lateral surface 263 extends between the first surface 261 and the second surface 262. In some embodiments, the first surface 261 of the semiconductor die 26 contacts the surface of the release film 48. The semiconductor die 26 may include a plurality of conductive pillars 264 disposed adjacent to the first surface 261 and embedded in the release film 48. That is, the first surface 261 of the semiconductor die 26 is attached or adhered to the release film 48 on the carrier 46, and such process is referred to as a "face down process." In addition, as shown in FIG. 9, the encapsulant 28 has a first surface 281 and a second surface 282 opposite to the first surface 281. The second surface 282 of the encapsulant 28 may be higher than the second surface 262 of the semiconductor die 26, so that the encapsulant 28 covers the second surface 262 and the lateral surface 263 of the semiconductor die 26.

Figure 10:
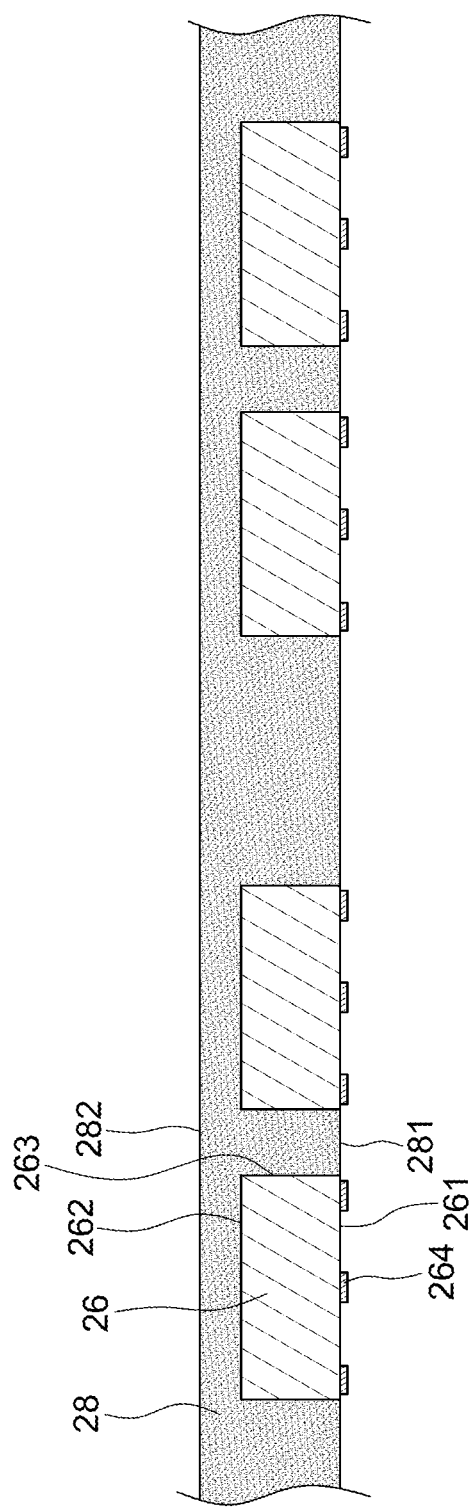
FIG. 10 illustrates one or more stages of an example of a method for manufacturing a semiconductor package structure according to some embodiments of the present disclosure.

Referring to FIG. 10, the carrier 46 and the release film 48 are removed by, for example, stripping, so that the first surface 261 of the semiconductor die 26 is substantially coplanar with the first surface 281 of the encapsulant 28. In other words, the first surface 261 of the semiconductor die 26 may be exposed from the first surface 281 of the encapsulant 28.

Figure 11:
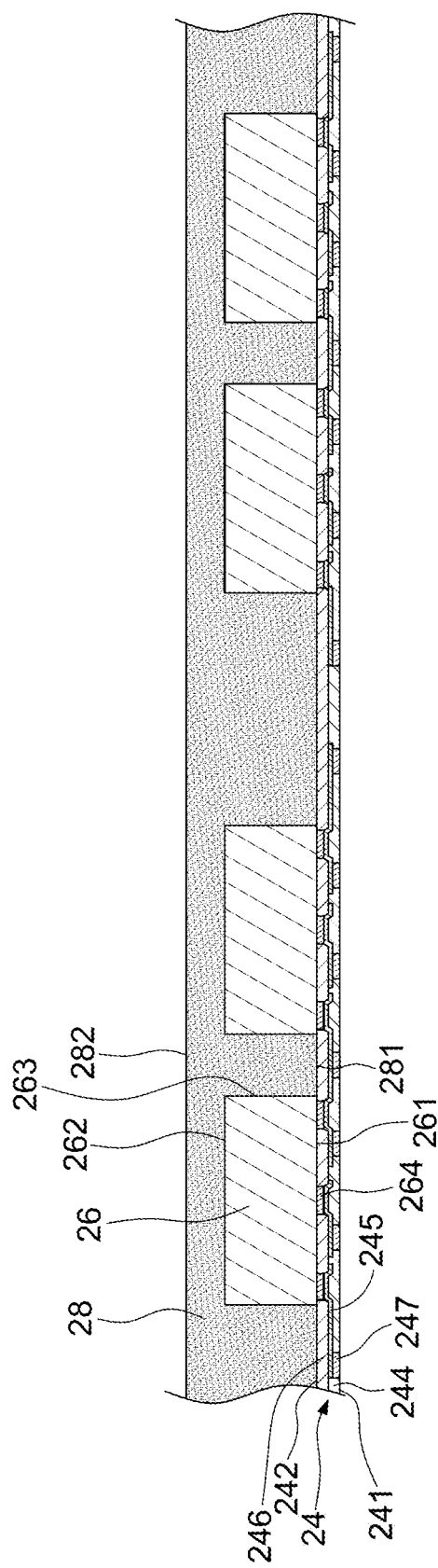
FIG. 11 illustrates one or more stages of an example of a method for manufacturing a semiconductor package structure according to some embodiments of the present disclosure.

Referring to FIG. 11, a conductive structure 24 is formed or disposed on the first surface 261 of the semiconductor die 26 and the first surface 281 of the encapsulant 28. The conductive structure 24 has a first surface 241 and a second surface 242 opposite to the first surface 242, and is electrically connected to the semiconductor die 26. The conductive structure 24 includes at least one dielectric layer (including, for example, a first dielectric layer 244 and a second dielectric layer 246), at least one redistribution layer 245 and a plurality of electrical connectors 247. As shown in FIG. 11, the second dielectric layer 246 is formed or disposed on the first surface 261 of the semiconductor die 26 and the first surface 281 of the encapsulant 28, and defines a plurality of openings to expose the conductive pillars 264 of the semiconductor die 26. The redistribution layer 245 is formed or disposed on the second dielectric layer 246 and in its openings to contact the conductive pillars 264. The first dielectric layer 244 is formed or disposed on the second dielectric layer 246 to cover the redistribution layer 245. Thus, the redistribution layer 245 is disposed between the first dielectric layer 244 and the second dielectric layer 246. The first dielectric layer 244 defines a plurality of openings to accommodate the electrical connectors 247 to contact the redistribution layer 245. However, the number of the dielectric layer may be two, three, four or more, and the number of the redistribution layer may be one, two, three or more. The dielectric layer (including, for example, the first dielectric layer 244 and the second dielectric layer 246) may include, or be formed from, a photoresist layer, a cured photo sensitive material, a cured photoimageable dielectric (PID) material such as epoxy or polyimide (PI) including photoinitiators, or a combination of two or more thereof. In some embodiments, the second dielectric layer 246 may be an innermost dielectric layer, and the first dielectric layer 244 may be an outermost dielectric layer. The electrical connectors 247 may be embedded in the first dielectric layer 244 to contact and electrically connect the redistribution layer 245. The electrical connectors 247 extend through and are exposed from the first dielectric layer 244. The redistribution layer 245 may be a patterned circuit layer. For example, the line width/line space (L/S) of the redistribution layer 245 may be about 2 micrometers (μm)/about 2 μm or less.

Figure 12:
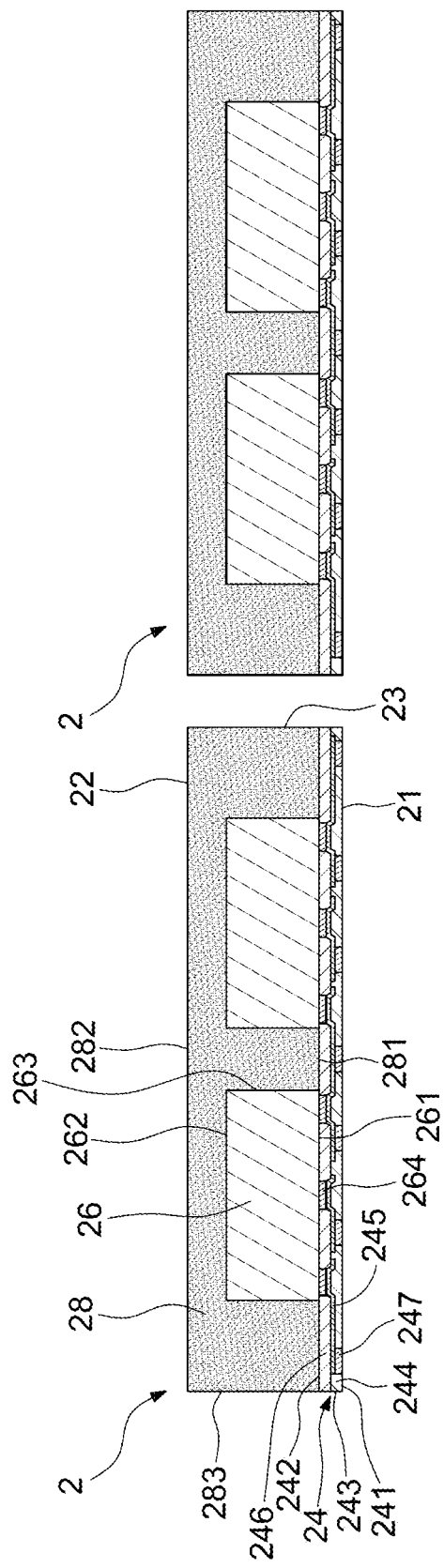
FIG. 12 illustrates one or more stages of an example of a method for manufacturing a semiconductor package structure according to some embodiments of the present disclosure.

Referring to FIG. 12, a singulation process is conducted by sawing the encapsulant 28 and the conductive structure 24 by blade to form a plurality of semiconductor modules 2. In some embodiments, the semiconductor module 2 has a first surface 21, a second surface 22 opposite to the first surface and a lateral surface 23 extending between the first surface 21 and the second surface 22. Further, the semiconductor module 2 includes the conductive structure 24, at least one semiconductor die 26 and the encapsulant 28. A lateral surface 243 of the conductive structure 24 is substantially coplanar with a lateral surface 283 of the encapsulant 28.

Figure 13:
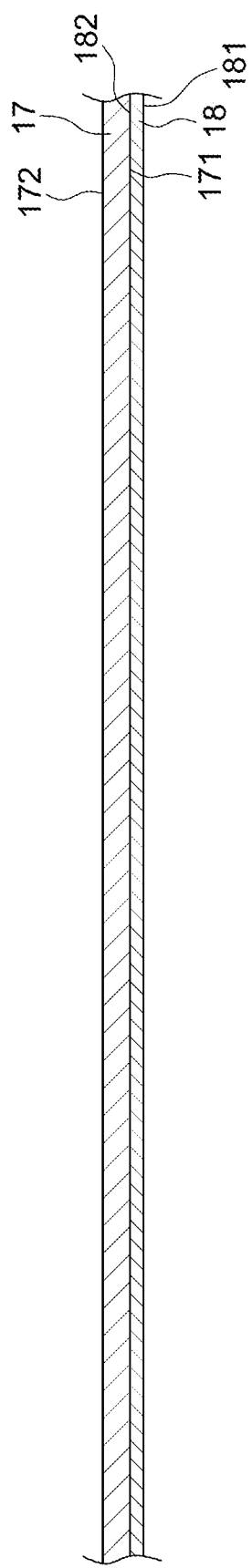
FIG. 13 illustrates one or more stages of an example of a method for manufacturing a semiconductor package structure according to some embodiments of the present disclosure.

Referring to FIG. 13, a base material 17 and an adhesion layer 18 are provided. The base material 17 may include resin such as BT resin. The base material 17 has a first surface 171 and a second surface 172 opposite to the first surface 171. In some embodiments, a coefficient of thermal expansion (CTE) of the base material 17 is less than 5 parts-per-million per degree Celsius (ppm/° C.) so as to reduce the warpage of the semiconductor package structure 1. A Young's modulus of the base material 17 is greater than 2500 Pa, and a melting point of the base material 17 is greater than 260° C. In addition, the adhesion layer 18 is formed or disposed on the first surface 171 of the base material 17. The adhesion layer 18 has a first surface 181 and a second surface 182 opposite to the first surface 181. In some embodiments, the adhesion layer 18 may be a thermal release film including epoxy. In other words, the adhesion layer 18 may be a tape that is not sticky at room temperature and becomes adhesive after heating. In some embodiments, a material of adhesion layer 18 may be the same as or different from a material of the base material 17.

Figure 14:
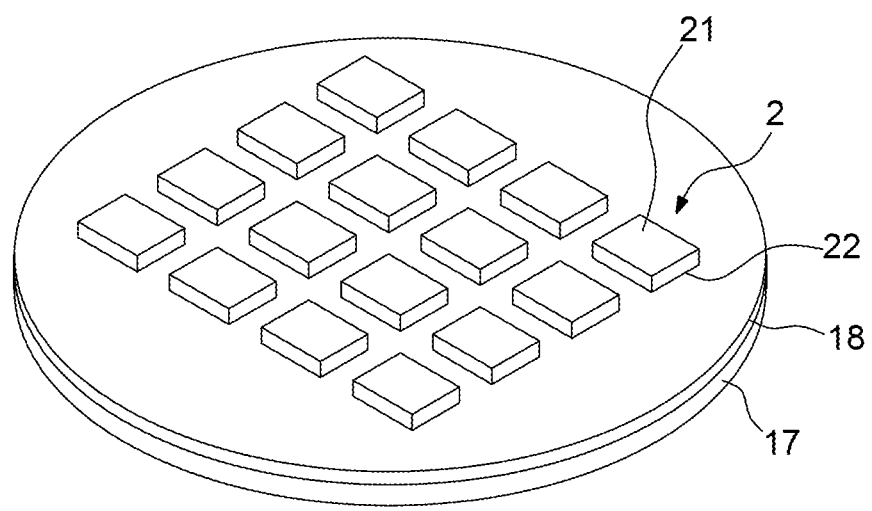
FIG. 14 illustrates one or more stages of an example of a method for manufacturing a semiconductor package structure according to some embodiments of the present disclosure.

Referring to FIG. 14, the semiconductor modules 2 are attached to the base material 17 through the adhesion layer 18. Thus, the adhesion layer 18 is disposed between the second surface 22 of the semiconductor module 2. In some embodiments, the semiconductor modules 2 may be tested, and the known good semiconductor modules 2 are reconstituted or rearranged on the adhesion layer 18 on the base material 17.

Figure 15:
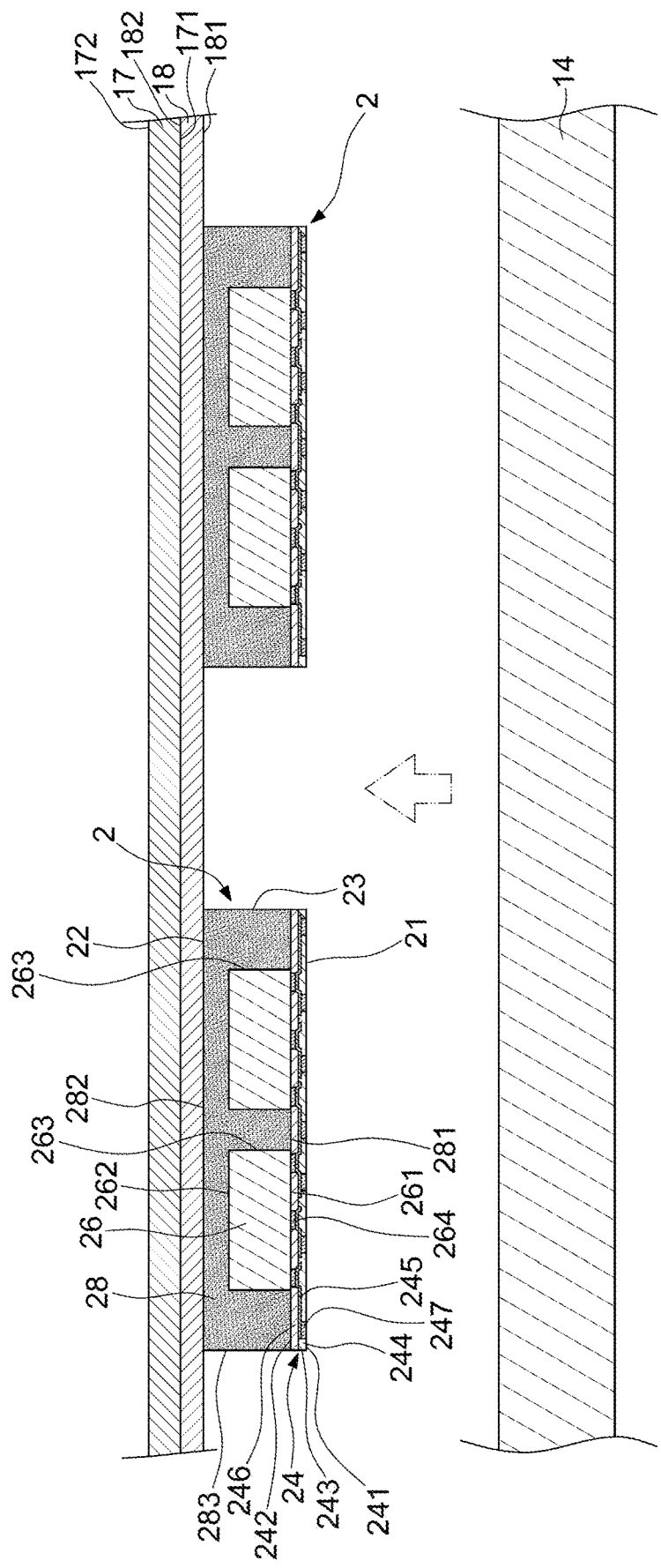
FIG. 15 illustrates one or more stages of an example of a method for manufacturing semiconductor package structure according to some embodiments of the present disclosure.
Figure 16:
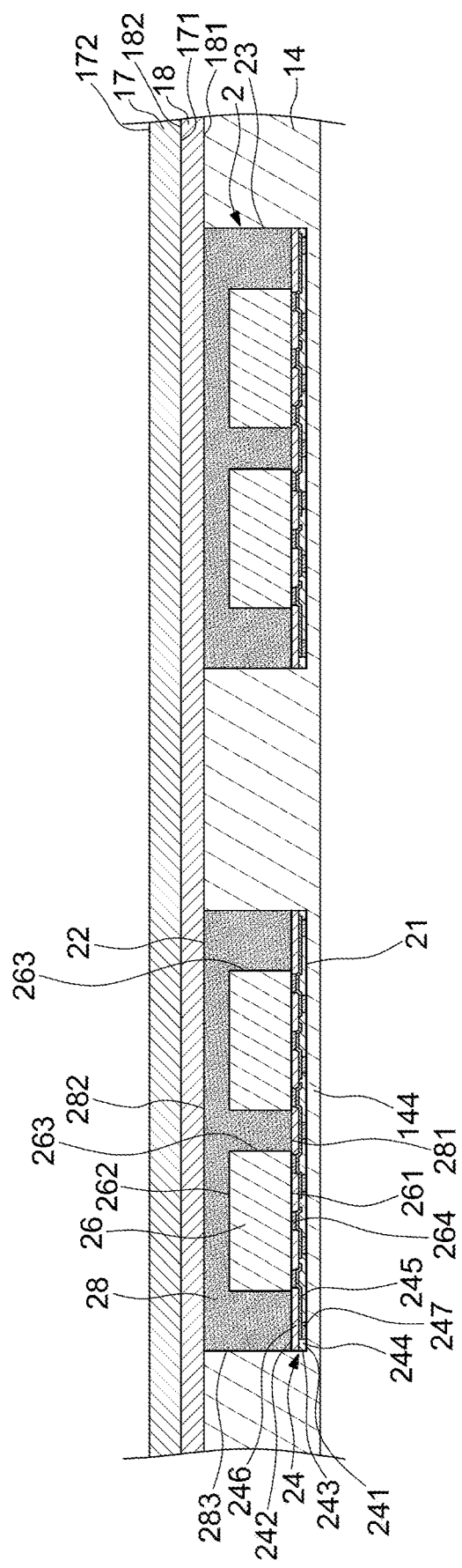
FIG. 16 illustrates one or more stages of an example of a method for manufacturing a semiconductor package structure according to some embodiments of the present disclosure.

Referring to FIG. 15 and FIG. 16, a protection layer 14 is formed or disposed on the adhesion layer 18 to cover the lateral surface 23 of the semiconductor module 2, the first surface 21 of the semiconductor module 2 (e.g., the first surface 241 of the wiring structure 24), and the first surface 181 of the adhesion layer 18. The protection layer 14 may include, or be formed from, a photoresist layer, a cured photo sensitive material, a cured photoimageable dielectric (PID) material such as epoxy or polyimide (PI) including photoinitiators, or a combination of two or more thereof. In some embodiments, a film type material 14, such as Ajinomoto build-up film (ABF), is laminated on the adhesion layer 18 to cover the lateral surface 23 and the first surface 21 of the semiconductor module 2 and the first surface 181 of the adhesion layer 18. Then, the film type material 14 is cured to form the protection layer 14. In some embodiments, a liquid type material, such as solder mask, is printed on the adhesion layer 18 to cover the lateral surface 23 and the first surface 21 of the semiconductor module 2 and the first surface 181 of the adhesion layer 18. Then, the liquid type material is cured to form the protection layer 14. In some embodiments, the material of the protection layer 14 may be the same as or different from the material of the dielectric layer (including, for example, the first dielectric layer 244 and the second dielectric layer 246) of the conductive structure 24. In addition, the material of the protection layer 14 may be different from the material of the encapsulant 28. For example, the encapsulant 28 may include fillers and the protection layer 14 may not include any fillers. As shown in FIG. 16, a first portion 144 of the protection layer 14 may cover the first surface 21 of the semiconductor module 2 (e.g., the first surface 241 of the wiring structure 24).

Figure 17:
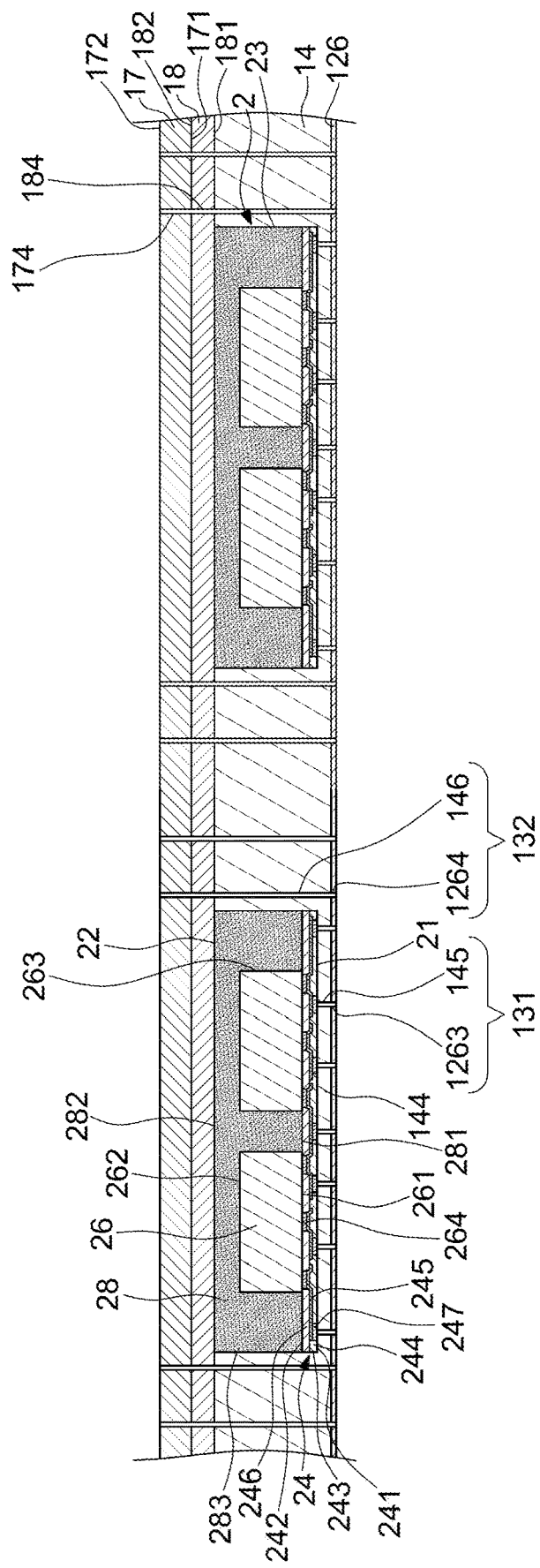
FIG. 17 illustrates one or more stages of an example of a method for manufacturing a semiconductor package structure according to some embodiments of the present disclosure.

Referring to FIG. 17, a second dielectric layer 126 is formed or disposed on the protection layer 14. Then, a plurality of inner holes 131 and a plurality of outer holes 132 are formed by, for example, dry sandblasting or other suitable technique. The inner hole 131 includes an inner through holes 1263 extending through the second dielectric layer 126 and an inner through hole 145 extending through the first portion 144 of the protection layer 14 to expose the conductive pillars 264. The outer hole 132 includes an outer through hole 1264 extending through the second dielectric layer 126, an outer through hole 146 extending through the protection layer 14, a through hole 184 extending through the adhesion layer 18, and a through hole 174 extending through the base material 17. The outer holes 132 surround the semiconductor module 2. Since the inner holes 131 and the outer holes 132 may be formed by dry sandblasting, delamination or crack at the boundary between the second dielectric layer 126 and the protection layer 14, at the boundary between the protection layer 14 and the adhesion layer 18, and at the boundary between the adhesion layer 18 the base material 17 will not readily occur. Further, an aspect ratio (a ratio of depth to width) of the outer hole 132 may be greater than or equal to about 25:1, about 30:1, about 35:1, or about 40:1. A ratio of a maximum diameter of a first end (e.g., a bottom end) of the single outer hole 132 to a maximum diameter of a second end (e.g., a top end) of the single outer hole 132 is about 1:0.7 to about 1:0.95. That is, the single outer hole 132 has a substantially consistent diameter. In some embodiments, a maximum diameter of the single outer hole 132 (e.g., a maximum diameter of the bottom end) is less than 100 μm. In an embodiment that diamond particles having a size of 2-4 μm are used in the dry sandblasting process, a surface roughness of sidewalls of the inner holes 131 and the outer holes 132 may be less than about 0.08 μm. In an embodiment that diamond particles having a size of 4-6 μm are used in the dry sandblasting process, a surface roughness of sidewalls of the inner holes 131 and the outer holes 132 may be less than about 0.09 μm.

Figure 18:
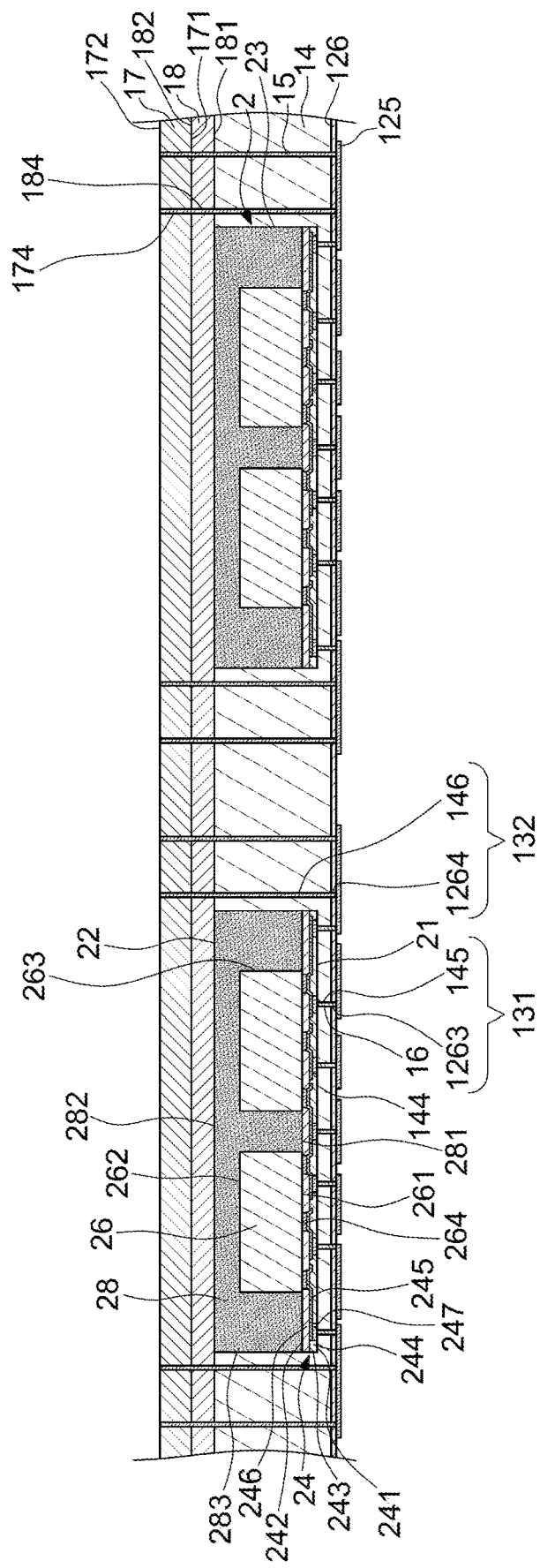
FIG. 18 illustrates one or more stages of an example of a method for manufacturing a semiconductor package structure according to some embodiments of the present disclosure.

Referring to FIG. 18, a conductive material is formed or disposed in the inner holes 131 and the outer holes 132 to form a plurality of inner conductive vias 16 and a plurality of outer conductive vias 15, respectively. Thus, the inner conductive vias 16 extend through the second dielectric layer 126 and the first portion 144 of the protection layer 14 to contact the conductive pillars 264. The outer conductive vias 15 extend through the second dielectric layer 126, the protection layer 14, the adhesion layer 18, and the base material 17. The outer conductive vias 15 surround the semiconductor module 2. Further, a patterned circuit layer (e.g., a redistribution layer 125) is formed on the second dielectric layer 126. The inner conductive vias 16 and the outer conductive vias 15 are electrically connected to the patterned circuit layer (e.g., the redistribution layer 125). In some embodiments, the inner conductive vias 16, the outer conductive vias 15 and the patterned circuit layer (e.g., the redistribution layer 125) may be formed concurrently at a process stage.

Figure 19:
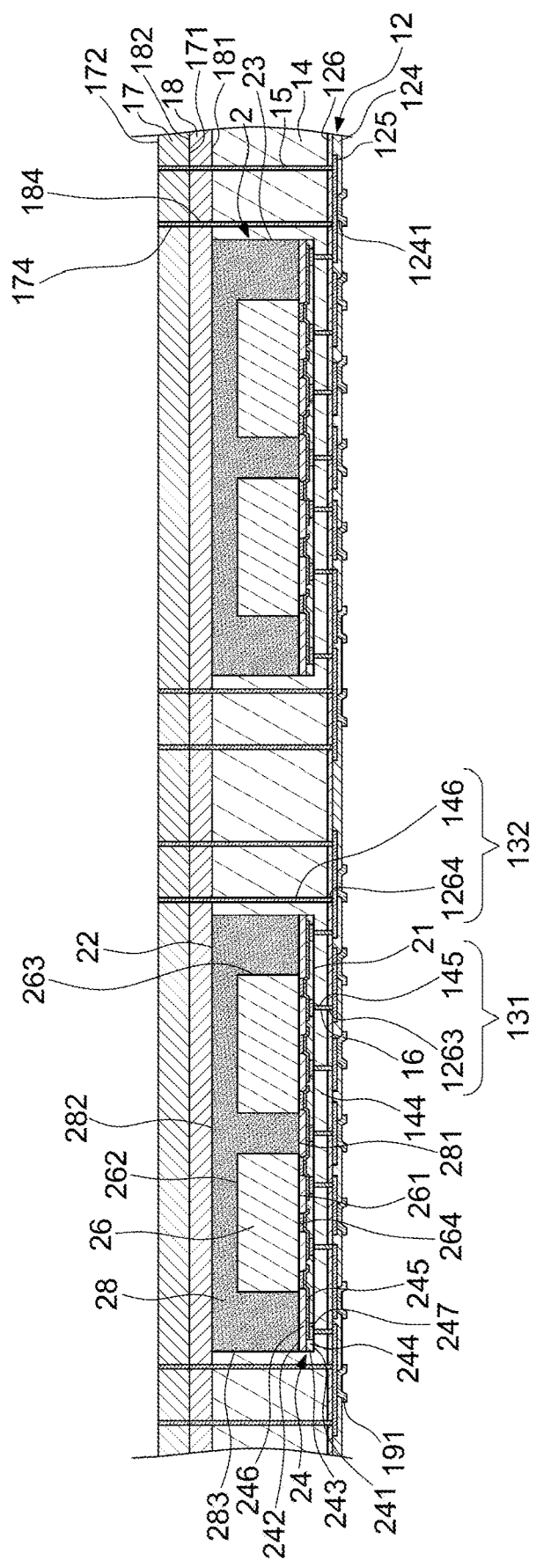
FIG. 19 illustrates one or more stages of an example of a method for manufacturing a semiconductor package structure according to some embodiments of the present disclosure.

Referring to FIG. 19, an outermost dielectric layer (e.g., a first dielectric layer 124) is formed or disposed on the second dielectric layer 126 to cover the patterned circuit layer (e.g., the redistribution layer 125) to form a wiring structure 12. The first dielectric layer 124 may include, or be formed from, a photoresist layer, a cured photo sensitive material, a cured photoimageable dielectric (PID) material such as epoxy or polyimide (PI) including photoinitiators, or a combination of two or more thereof. In some embodiments, the material of the protection layer 14 may be the same as or different from the material of the dielectric layer (including, for example, the first dielectric layer 124 and the second dielectric layer 126) of the wiring structure 12. The semiconductor modules 2 and the outer conductive vias 15 are electrically connected to the wiring structure 12. A line width/line space (L/S) of the redistribution layer 245 of the conductive structure 24 is less than the line width/line space (L/S) of the redistribution layer 125 of the wiring structure 12.

Then, a plurality of openings 1241 are formed in the first dielectric layer 124 of the wiring structure 12 to expose portions of the redistribution layer 125 of the wiring structure 12. Then, a plurality of first under bump metallization (UBM) layers 191 are respectively formed or disposed in respective ones of the openings 1241 of the first dielectric layer 124 of the wiring structure 12 to contact the exposed portions of the redistribution layer 125 of the wiring structure 12.

Figure 20:
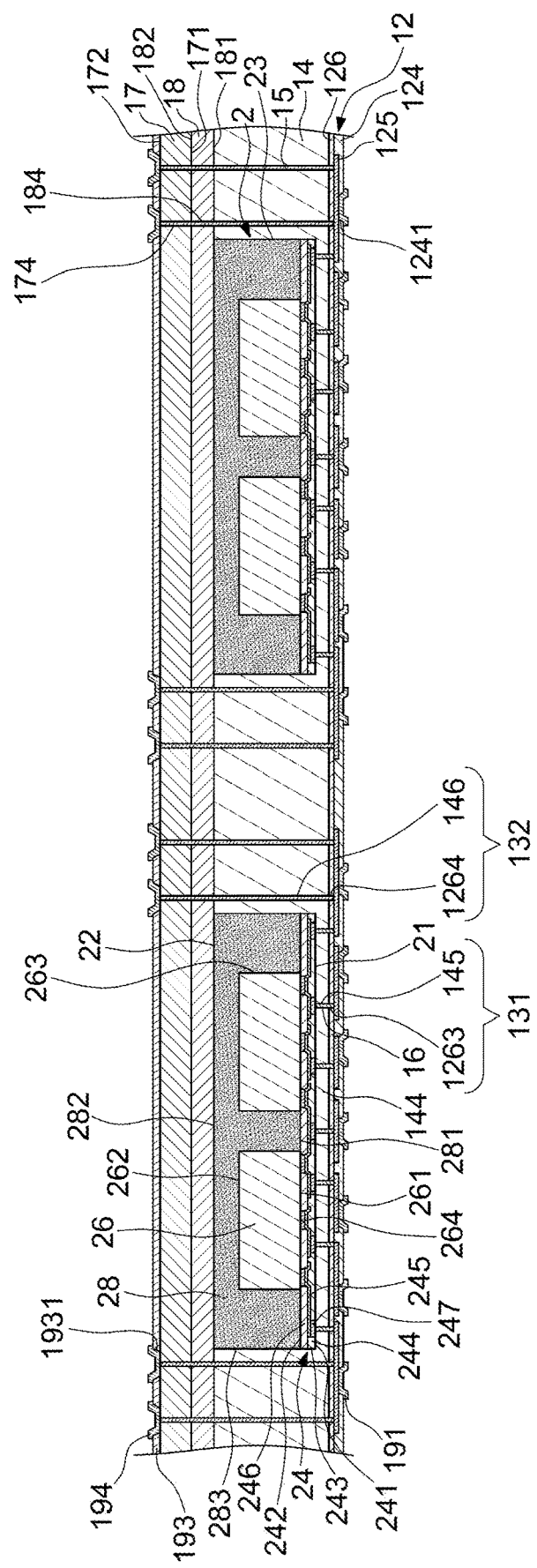
FIG. 20 illustrates one or more stages of an example of a method for manufacturing a semiconductor package structure according to some embodiments of the present disclosure.

Referring to FIG. 20, an insulation layer 193 (e.g., a solder mask) is formed or disposed on the second surface 172 of the base material 17, and defines a plurality of openings 1931 to expose an top end of the outer conductive via 15. Then, a plurality of second under bump metallization (UBM) layers 194 are respectively disposed in respective ones of the openings 1931 of the insulation layer 193 to contact the outer conductive via 15 for external connection.

Figure 21:
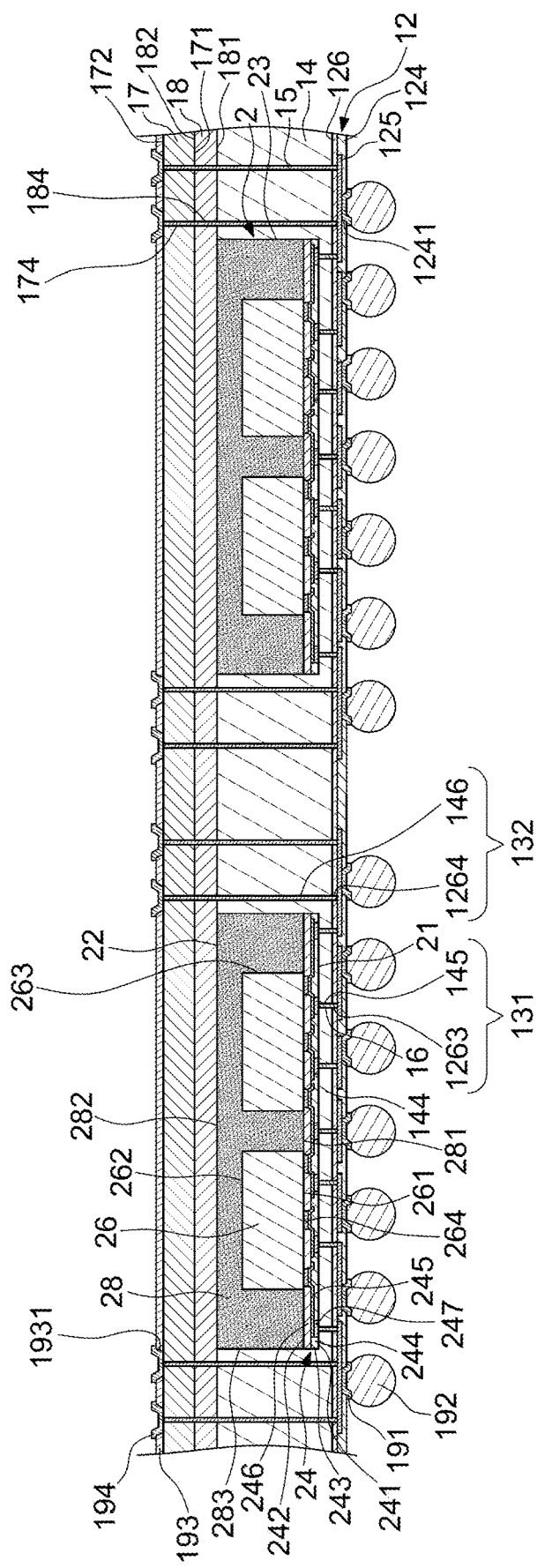
FIG. 21 illustrates one or more stages of an example of a method for manufacturing a semiconductor package structure according to some embodiments of the present disclosure.

Referring to FIG. 21, a plurality of solder balls 192 are respectively disposed on respective ones of the first under bump metallization (UBM) layers 191 for external connection, and are electrically connected to the redistribution layer 125 of the wiring structure 12 through the first under bump metallization (UBM) layers 191. Then, a singulation stage is conducted to saw the wiring structure 12, the protection layer 14, the adhesion layer 18 and the base material 17 to obtain the semiconductor package structure 1 of FIG. 1.

Figure 22:
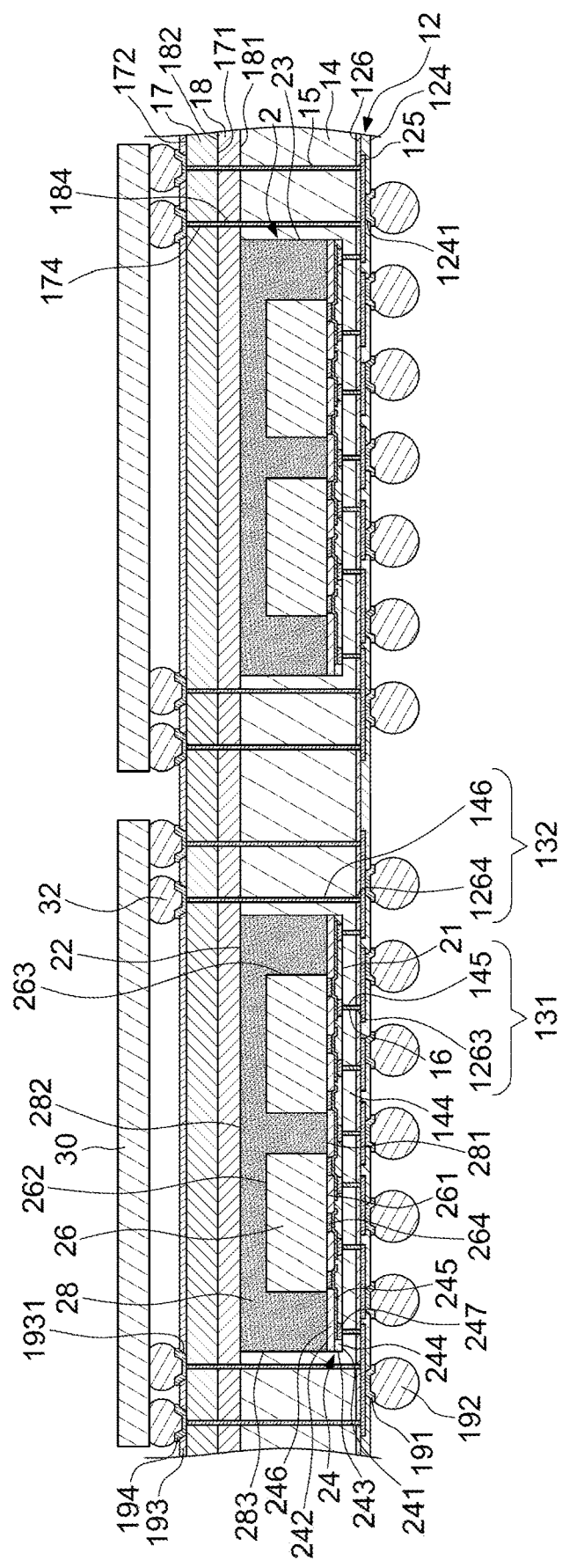
FIG. 22 illustrates one or more stages of an example of a method for manufacturing a semiconductor package structure according to some embodiments of the present disclosure.

FIG. 22 illustrates a method for manufacturing a semiconductor package structure according to some embodiments of the present disclosure. In some embodiments, the method is for manufacturing a semiconductor package structure such as the semiconductor package structure 1d shown in FIG. 5. The initial stages of the illustrated process are the same as, or similar to, the stages illustrated in FIG. 7 to FIG. 21. FIG. 22 depicts a stage subsequent to that depicted in FIG. 21.

Referring to FIG. 22, a plurality of semiconductor chips 30 are electrically connected and bonded to the second under bump metallization (UBM) layers 194 through a plurality of connecting elements 32 (e.g., solder bumps or other conductive bumps). Then, a singulation stage is conducted to saw the wiring structure 12, the protection layer 14, the adhesion layer 18 and the base material 17 to obtain the semiconductor package structure 1d of FIG. 5.

Figure 23:
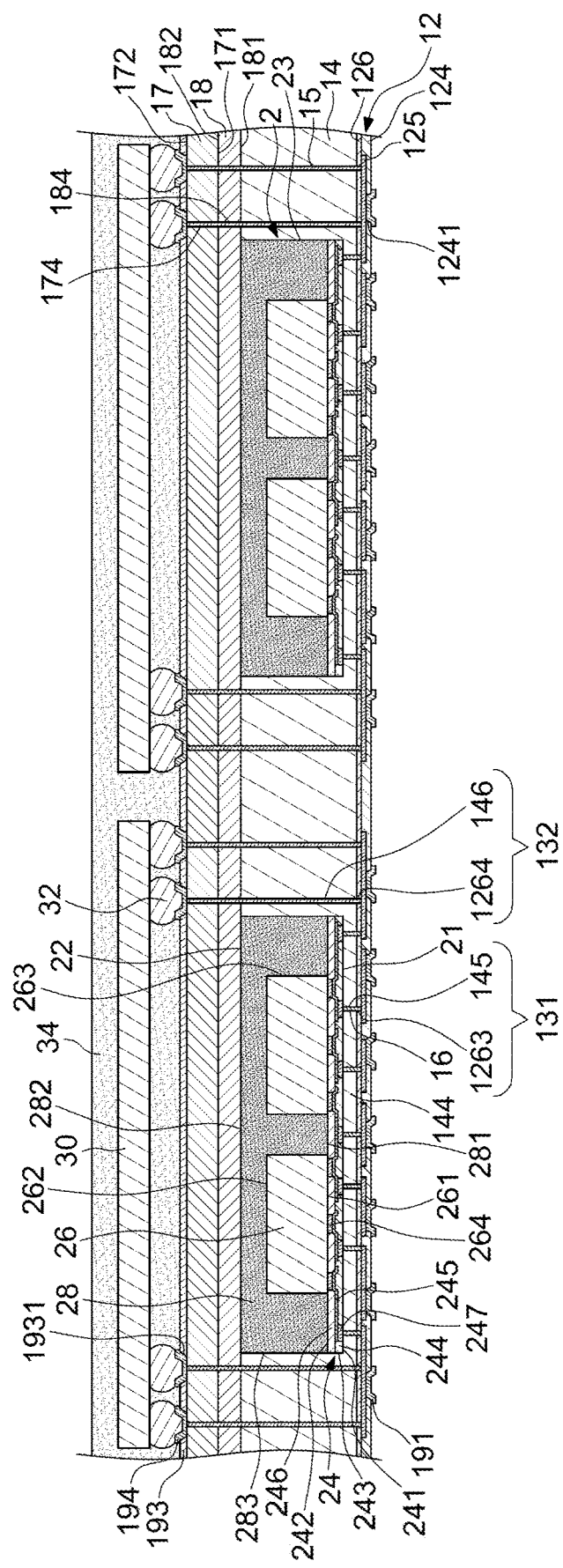
FIG. 23 illustrates one or more stages of an example of a method for manufacturing a semiconductor package structure according to some embodiments of the present disclosure.
Figure 24:
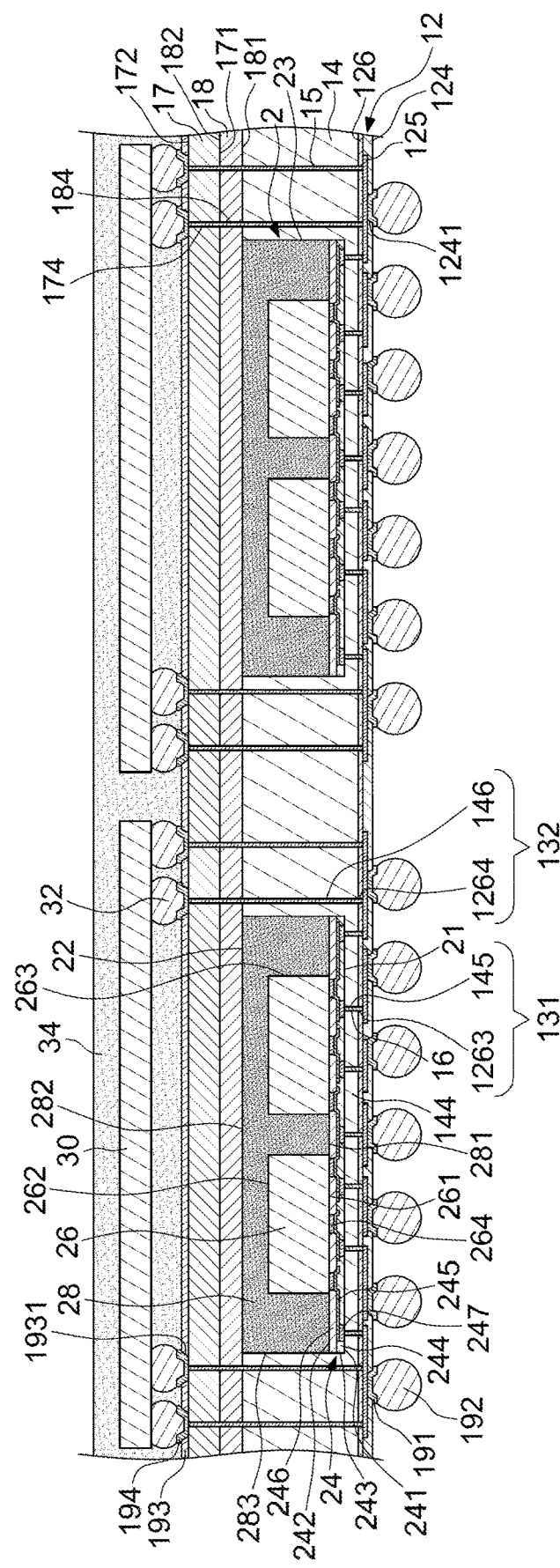
FIG. 24 illustrates one or more stages of an example of a method for manufacturing a semiconductor package structure according to some embodiments of the present disclosure.

FIG. 23 to FIG. 24 illustrate a method for manufacturing a semiconductor package structure according to some embodiments of the present disclosure. In some embodiments, the method is for manufacturing a semiconductor package structure such as the semiconductor package structure 1e shown in FIG. 6. The initial stages of the illustrated process are the same as, or similar to, the stages illustrated in FIG. 7 to FIG. 20. FIG. 23 depicts a stage subsequent to that depicted in FIG. 20.

Referring to FIG. 23, a plurality of semiconductor chips 30 are electrically connected and bonded to the second under bump metallization (UBM) layers 194 through a plurality of connecting elements 32 (e.g., solder bumps or other conductive bumps). Then, a package body 34 (e.g., a molding compound) is formed or disposed on the insulation layer 193 to cover and protect the semiconductor chips 30 and the connecting elements 32.

Referring to FIG. 24, a plurality of solder balls 192 are respectively disposed on respective ones of the first under bump metallization (UBM) layers 191 for external connection, and are electrically connected to the redistribution layer 125 of the wiring structure 12 through the first under bump metallization (UBM) layers 191. Then, a singulation stage is conducted to saw the wiring structure 12, the protection layer 14, the adhesion layer 18, the base material 17 and the package body 34 to obtain the semiconductor package structure 1e of FIG. 6.

FIG. 25 to FIG. 30 illustrate a method for manufacturing a semiconductor package structure according to some embodiments of the present disclosure. In some embodiments, the method is for manufacturing a semiconductor package structure such as the semiconductor package structure 1b shown in FIG. 3.

Figure 25:
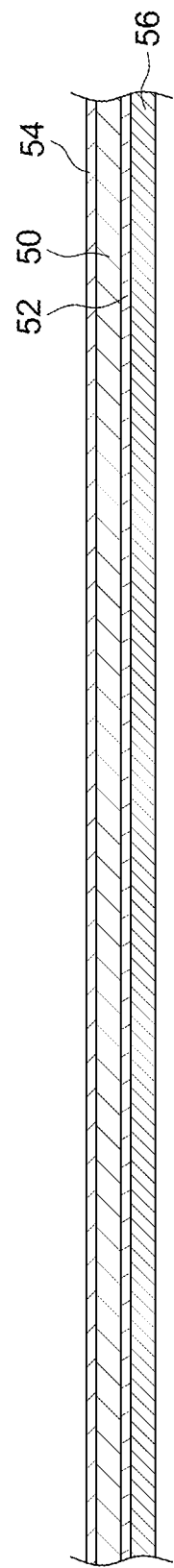
FIG. 25 illustrates one or more stages of an example of a method for manufacturing semiconductor package structure according to some embodiments of the present disclosure.

Referring to FIG. 25, a substrate 50 with a first copper foil 52 and a second copper foil 54 formed or disposed on two opposite surface of the substrate 50 is provided. Then, a base material 56 (e.g., metal layer) is formed or disposed on the first copper foil 52.

Figure 26:
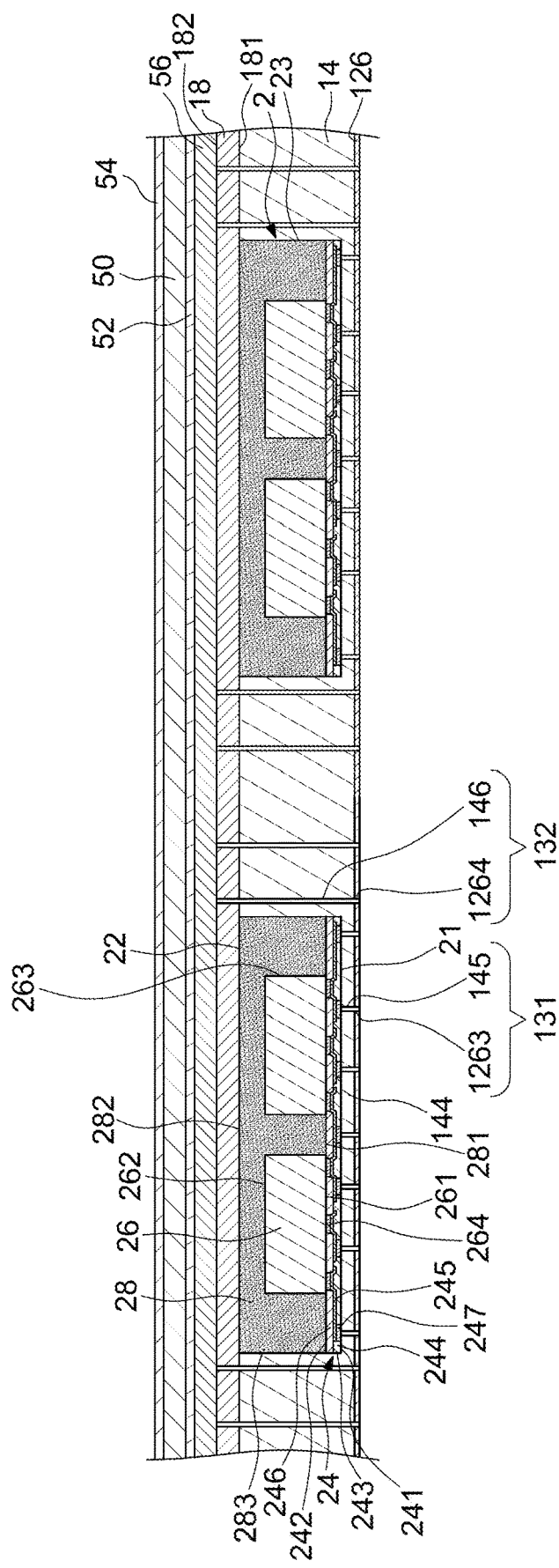
FIG. 26 illustrates one or more stages of an example of a method for manufacturing a semiconductor package structure according to some embodiments of the present disclosure.

Referring to FIG. 26, the semiconductor modules 2 are attached to the base material 56 through the adhesion layer 18. Then, a protection layer 14 is formed or disposed on the adhesion layer 18 to cover the lateral surface 23 of the semiconductor module 2, the first surface 21 of the semiconductor module 2 (e.g., the first surface 241 of the wiring structure 24), and the first surface 181 of the adhesion layer 18. Then, a second dielectric layer 126 is formed or disposed on the protection layer 14. Then, a plurality of inner holes 131 and a plurality of outer holes 132 are formed by, for example, dry sandblasting or other suitable technique. The outer hole 132 may terminate at or on the base material 56.

Figure 27:
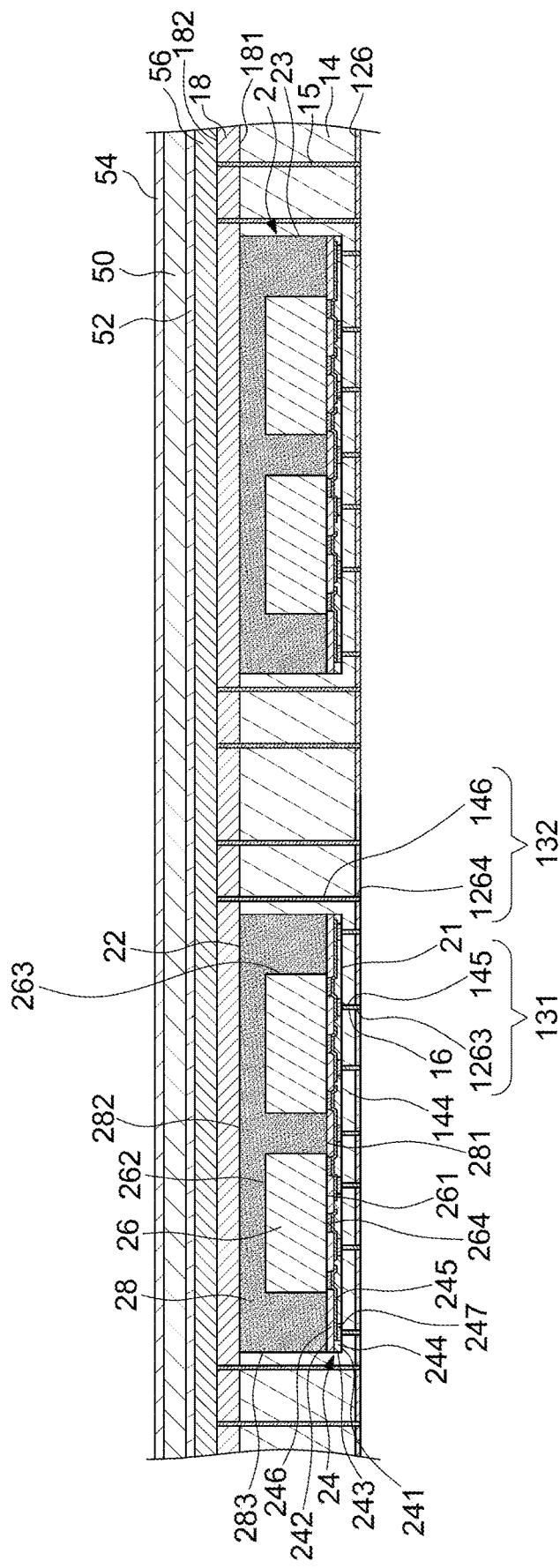
FIG. 27 illustrates one or more stages of an example of a method for manufacturing a semiconductor package structure according to some embodiments of the present disclosure.

Referring to FIG. 27, a conductive material is formed or disposed in the inner holes 131 and the outer holes 132 to form a plurality of inner conductive vias 16 and a plurality of outer conductive vias 15, respectively. Thus, the inner conductive vias 16 extend through the second dielectric layer 126 and the first portion 144 of the protection layer 14 to contact the conductive pillars 264. The outer conductive vias 15 extend through the second dielectric layer 126, the protection layer 14 and the adhesion layer 18. The outer conductive via 15 may terminate at or on the base material 56. Further, a patterned circuit layer (e.g., a redistribution layer 125) is formed on the second dielectric layer 126. The inner conductive vias 16 and the outer conductive vias 15 are electrically connected to the patterned circuit layer (e.g., the redistribution layer 125). In some embodiments, the inner conductive vias 16, the outer conductive vias 15 and the patterned circuit layer (e.g., the redistribution layer 125) may be formed concurrently at a process stage.

Figure 28:
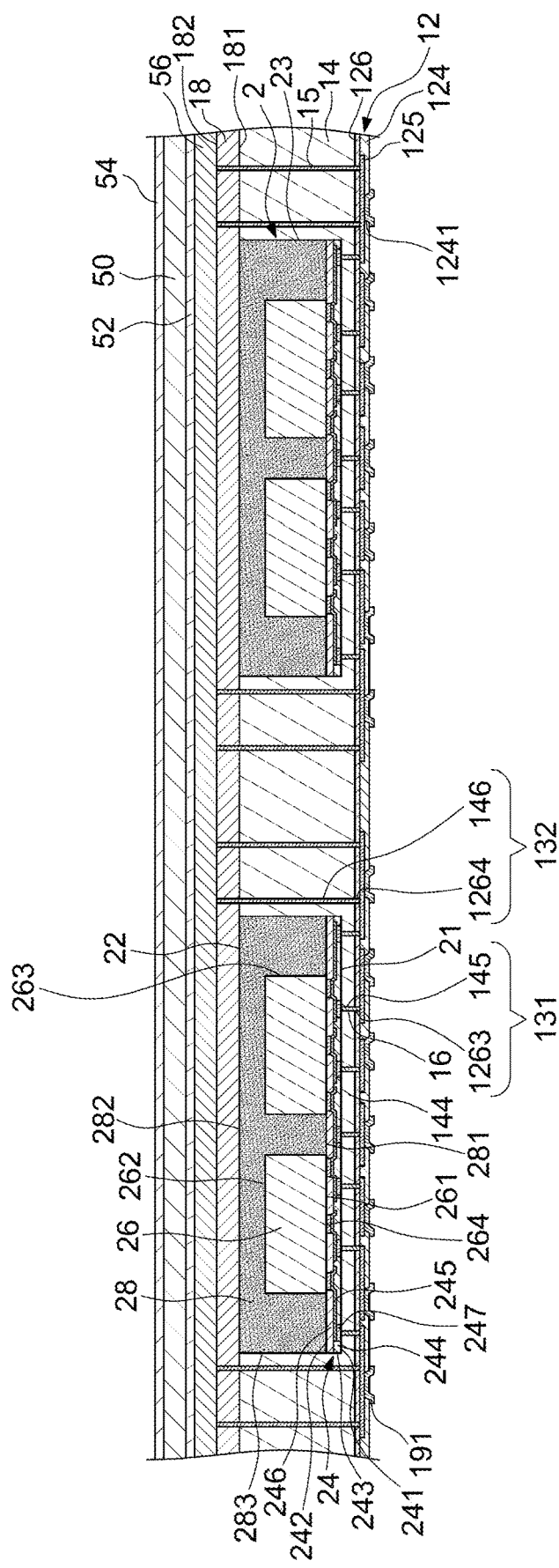
FIG. 28 illustrates one or more stages of an example of a method for manufacturing a semiconductor package structure according to some embodiments of the present disclosure.

Referring to FIG. 28, an outermost dielectric layer (e.g., a first dielectric layer 124) is formed or disposed on the second dielectric layer 126 to cover the patterned circuit layer (e.g., the redistribution layer 125) to form a wiring structure 12. Then, a plurality of openings 1241 are formed in the first dielectric layer 124 of the wiring structure 12 to expose portions of the redistribution layer 125 of the wiring structure 12. Then, a plurality of first under bump metallization (UBM) layers 191 are respectively formed or disposed in respective ones of the openings 1241 of the first dielectric layer 124 of the wiring structure 12 to contact the exposed portions of the redistribution layer 125 of the wiring structure 12.

Figure 29:
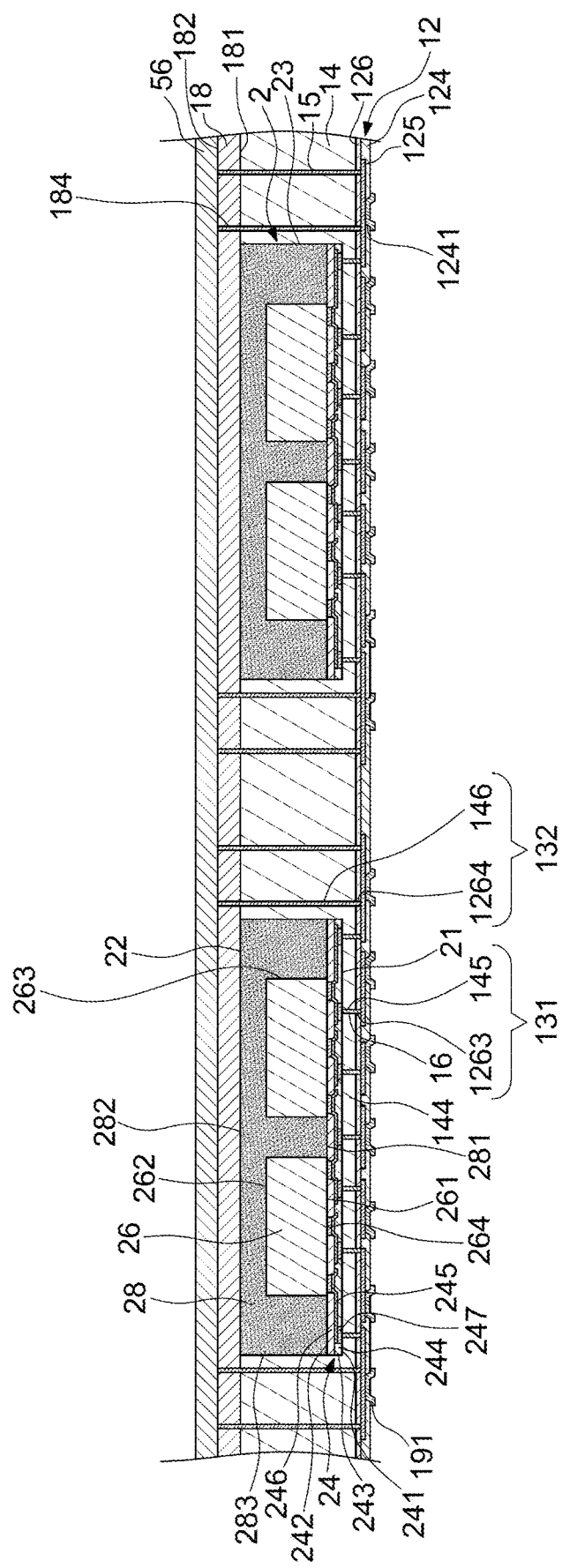
FIG. 29 illustrates one or more stages of an example of a method for manufacturing a semiconductor package structure according to some embodiments of the present disclosure.

Referring to FIG. 29, the substrate 50 with the first copper foil 52 and the second copper foil 54 is removed. The base material 56 remains on the adhesion layer 18.

Figure 30:
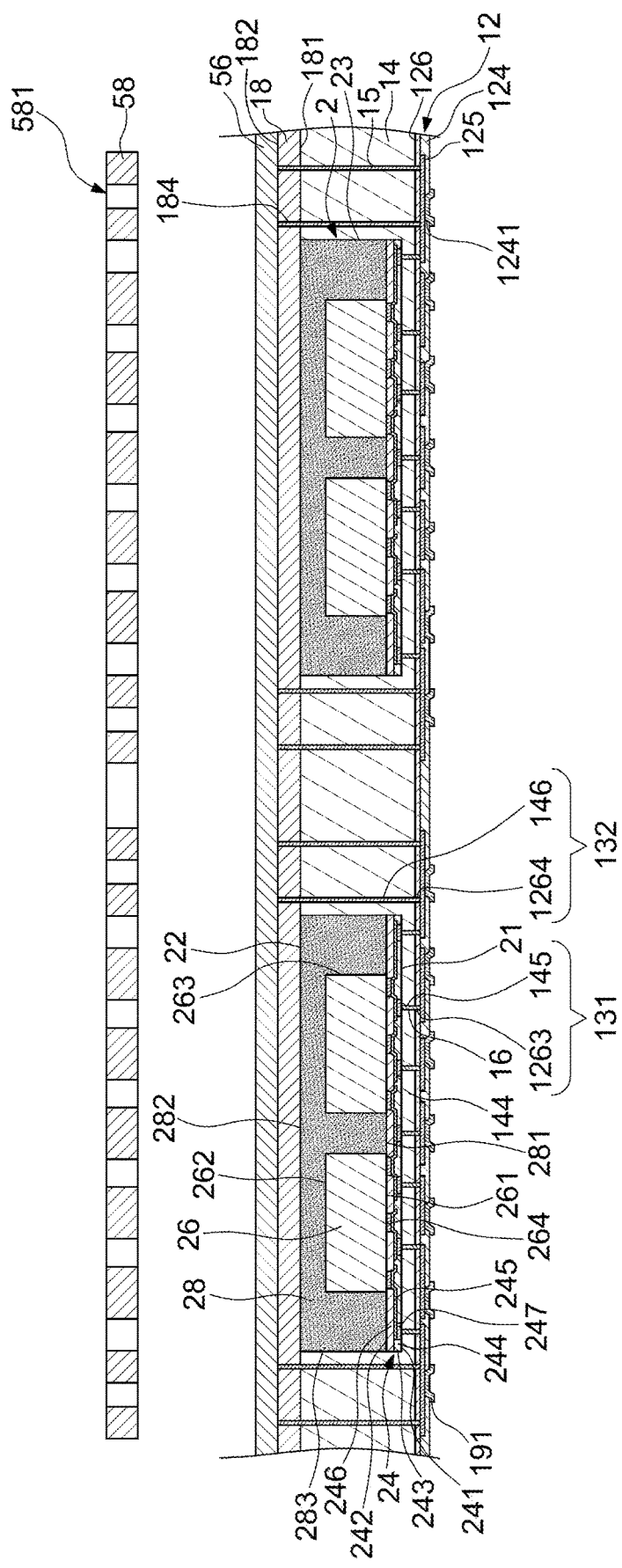
FIG. 30 illustrates one or more stages of an example of a method for manufacturing a semiconductor package structure according to some embodiments of the present disclosure.

Referring to FIG. 30, a mask 58 is provided above the base material 56. The mask 58 defines a plurality of openings 581. Then, the base material 56 is patterned to form a patterned circuit layer (e.g., the base material 17b) through the mask 58. Then, a singulation stage is conducted to saw the wiring structure 12, the protection layer 14 and the adhesion layer 18 to obtain the semiconductor package structure 1b of FIG. 3.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a wiring structure including at least one dielectric layer and at least one first redistribution layer;
   a semiconductor module electrically connected to the wiring structure, and having a first surface, a second surface opposite to the first surface and a first lateral surface extending between the first surface and the second surface;
   a protection layer covering the first lateral surface of the semiconductor module and a surface of the wiring structure, wherein a first portion of the protection layer is disposed between the semiconductor module and the wiring structure;
   a plurality of outer conductive vias surrounding the first lateral surface of the semiconductor module, electrically connected to the wiring structure, and extending through the at least one dielectric layer of the wiring structure and the protection layer; and
   a plurality of inner conductive vias electrically connecting the semiconductor module and the wiring structure, and extending through the dielectric layer of the wiring structure and the first portion of the protection layer, wherein the protection layer defines a plurality of first inner through holes corresponding to the semiconductor module, the dielectric layer of the wiring structure defines a plurality of second inner through holes, and each of the first inner through holes of the protection layer and each of the second inner through holes of the dielectric layer of the wiring structure collectively define a single inner hole for accommodating the inner conductive via.

2. The semiconductor package structure of claim 1, wherein the at least one dielectric layer of the wiring structure includes a first dielectric layer and a second dielectric layer, the at least one first redistribution layer is disposed between the first dielectric layer and the second dielectric layer, the protection layer covers the second dielectric layer of the wiring structure, and the outer conductive vias extend through the second dielectric layer of the wiring structure.

3. The semiconductor package structure of claim 1, wherein the semiconductor module includes:
   a conductive structure having a third surface and a fourth surface opposite to the third surface, and electrically connected to the wiring structure;
   at least one semiconductor die electrically connected to the conductive structure; and
   an encapsulant covering at least a portion of the at least one semiconductor die and the second surface of the conductive structure.

4. The semiconductor package structure of claim 3, wherein the conductive structure includes a third dielectric layer, a fourth dielectric layer, a second redistribution layer and a plurality of electrical connectors, the second redistribution layer is disposed between the third dielectric layer and the fourth dielectric layer, the encapsulant and the at least one semiconductor die contact the fourth dielectric layer of the conductive structure, the electrical connectors are electrically connected to the second redistribution layer and exposed from the third dielectric layer of the conductive structure, and the protection layer covers the third dielectric layer of the conductive structure.

5. The semiconductor package structure of claim 3, wherein the conductive structure has a second lateral surface, the encapsulant has a third lateral surface, and the second lateral surface of the conductive structure is substantially coplanar with the third lateral surface of the encapsulant.

6. The semiconductor package structure of claim 3, wherein the semiconductor die has an active surface and a backside surface opposite to the active surface, the encapsulant has a first surface and a second surface opposite to the first surface, and the active surface of the semiconductor die is substantially coplanar with the first surface of the encapsulant.

7. The semiconductor package structure of claim 1, wherein a material of the dielectric layer of the wiring structure is different from a material of the protection layer.

8. The semiconductor package structure of claim 1, wherein the protection layer is formed from a film type material.

9. A semiconductor package structure, comprising:
   a wiring structure including at least one dielectric layer and at least one first redistribution layer;
   a semiconductor module electrically connected to the wiring structure, and having a first surface, a second surface opposite to the first surface and a first lateral surface extending between the first surface and the second surface;
   a protection layer covering the first lateral surface of the semiconductor module and a surface of the wiring structure; and
   a plurality of outer conductive vias surrounding the first lateral surface of the semiconductor module, electrically connected to the wiring structure, and extending through the at least one dielectric layer of the wiring structure and the protection layer, wherein the protection layer defines a plurality of first outer through holes surrounding the semiconductor module, the dielectric layer of the wiring structure defines a plurality of second outer through holes, and each of the first outer through holes of the protection layer and each of the second outer through holes of the dielectric layer of the wiring structure collectively define a single outer hole for accommodating the outer conductive via.

10. The semiconductor package structure of claim 9, wherein the outer through hole of the protection layer and a respective one of the outer through holes of the dielectric layer of the wiring structure are formed by dry sandblasting.

11. The semiconductor package structure of claim 9, wherein a ratio of a maximum diameter of a first end of the single outer hole to a maximum diameter of a second end of the single outer hole is about 1:0.7 to about 1:0.95.

12. The semiconductor package structure of claim 9, wherein a surface roughness of a sidewall of the single outer hole is less than 0.08 μm.

13. The semiconductor package structure of claim 1, further comprising a base material, the semiconductor module is adhered to the base material through an adhesion layer.

14. The semiconductor package structure of claim 13, wherein the base material includes resin, and the outer conductive vias further extend through the base material.

15. The semiconductor package structure of claim 13, wherein a coefficient of thermal expansion (CTE) of the base material is less than 5 parts-per-million per degree Celsius (ppm/° C.).

16. The semiconductor package structure of claim 13, wherein the base material includes a circuit layer.

17. The semiconductor package structure of claim 13, wherein a lateral surface of the adhesion layer is substantially coplanar with a lateral surface of the base material, and the outer conductive vias further extend through the adhesion layer.

18. The semiconductor package structure of claim 9, wherein a maximum diameter of the single outer hole is less than 100 μm.

* * * * *